United States Patent
Seo et al.

(10) Patent No.: US 12,302,024 B2
(45) Date of Patent: May 13, 2025

(54) IMAGE SENSOR DEVICE

(71) Applicant: SAMSUNG ELECTRONICS CO., LTD., Suwon-si (KR)

(72) Inventors: Minwoong Seo, Hwaseong-si (KR); Myunglae Chu, Hwaseong-si (KR); Hyunyong Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 643 days.

(21) Appl. No.: 17/535,896

(22) Filed: Nov. 26, 2021

(65) Prior Publication Data
US 2022/0286636 A1   Sep. 8, 2022

(30) Foreign Application Priority Data
Mar. 2, 2021  (KR) .................. 10-2021-0027547

(51) Int. Cl.
*H04N 25/779*   (2023.01)
*H04N 25/772*   (2023.01)

(52) U.S. Cl.
CPC ......... *H04N 25/779* (2023.01); *H04N 25/772* (2023.01)

(58) Field of Classification Search
CPC .... H04N 25/74; H04N 25/745; H04N 25/772; H04N 25/779; H04N 25/7795
See application file for complete search history.

(56) References Cited

U.S. PATENT DOCUMENTS

| | | | |
|---|---|---|---|
| 6,654,057 B1 | 11/2003 | Rhodes | |
| 8,120,685 B2 | 2/2012 | Lee | |
| 8,711,262 B2 | 4/2014 | Nakano et al. | |
| 10,341,582 B2 | 7/2019 | Yamamoto | |
| 2004/0177299 A1* | 9/2004 | Wang | G01R 31/31858 714/726 |
| 2007/0046801 A1 | 3/2007 | Kasuga et al. | |
| 2010/0157083 A1 | 6/2010 | Ohya et al. | |
| 2018/0220096 A1* | 8/2018 | Shikina | H04N 25/74 |
| 2020/0162683 A1 | 5/2020 | Rotte et al. | |

FOREIGN PATENT DOCUMENTS

| | | |
|---|---|---|
| JP | 2019102968 A | 6/2019 |
| KR | 100640960 B1 | 11/2006 |

* cited by examiner

*Primary Examiner* — Daniel M Pasiewicz
(74) *Attorney, Agent, or Firm* — Wolf, Greenfield & Sacks, P.C.

(57) ABSTRACT

An image sensor device includes a pixel array, including digital pixels, and a pixel driver including a high-speed scanner that generates reset enable signals and signal enable signals. Each of the digital pixels includes a photo detector, a comparator, and a memory circuit. The high-speed scanner includes a first flip-flop and a second flip-flop. The first flip-flop receives a clock signal and a read trigger signal and outputs a first reset enable signal of the reset enable signals. The second flip-flop receives the clock signal and the first reset enable signal and outputs a first signal enable signal of the signal enable signals. The pixel array outputs a reset sampling value stored in the memory circuit in response to the first reset enable signal and outputs a signal sampling value stored in the memory circuit in response to the first signal enable signal.

11 Claims, 22 Drawing Sheets

IMAGE SENSOR DEVICE

CROSS-REFERENCE TO RELATED APPLICATIONS

This application claims priority under 35 U.S.C. § 119 to Korean Patent Application No. 10-2021-0027547 filed on Mar. 2, 2021, in the Korean Intellectual Property Office, the disclosure of which is incorporated by reference herein in its entirety.

BACKGROUND

Embodiments of the present disclosure described herein relate to a semiconductor device, and more particularly, relate to an image sensor device.

An image sensor may convert an optical signal into an electrical signal. As a computer industry and a communication industry develop, nowadays, there is an increasing demand on a high-performance image sensor in various fields of electronic devices such as a digital camera, a camcorder, a smartphone, a tablet personal computer (PC), a notebook, a game console, a security camera, and a medical micro camera.

A conventional image sensor has operated based on analog pixels. Each of the analog pixels outputs an analog signal corresponding to a light signal, and the analog signal is converted into a digital signal. However, because the analog signal is vulnerable to noise or coupling in comparison with a digital signal, the analog signal has a problem with the processing of a high-resolution image signal.

SUMMARY

Embodiments of the present disclosure provide an image sensor device with improved performance.

According to an embodiment, an image sensor device has a pixel array that includes a plurality of digital pixels. A pixel driver has a high-speed scanner that generates reset enable signals and signal enable signals and controls the plurality of digital pixels. A digital logic circuit performs a digital signal processing operation on a digital signal output from the plurality of digital pixels. Each of the plurality of digital pixels includes a photo detector, a comparator, and a memory circuit. The high-speed scanner includes a first flip-flop and a second flip-flop. The first flip-flop receives a clock signal and a read trigger signal and outputs a first reset enable signal of the reset enable signals. The second flip-flop receives the clock signal and the first reset enable signal and outputs a first signal enable signal of the signal enable signals. The pixel array outputs a reset sampling value stored in the memory circuit in response to the first reset enable signal and outputs a signal sampling value stored in the memory circuit in response to the first signal enable signal.

According to an embodiment, an image sensor device includes a pixel array having a plurality of digital pixels. A pixel driver includes a high-speed scanner that generates reset enable signals and signal enable signals and controls the plurality of digital pixels. Each of the plurality of digital pixels includes a photo detector, a comparator, and a memory circuit. The pixel array outputs reset sampling values and signal sampling values stored in memory circuits at high speed based on the reset enable signals and the signal enable signals. The high-speed scanner includes a first flip-flop, a first dummy flip-flop, and a second flip-flop. The first flip-flop receives a clock signal and a read trigger signal and outputs a first reset enable signal of the reset enable signals. The first dummy flip-flop receives the clock signal and the first reset enable signal and outputs a first dummy signal. The second flip-flop receives the clock signal and the first dummy signal and outputs a first signal enable signal of the signal enable signals.

According to an embodiment, an image sensor device includes a high-speed scanner that generates reset enable signals and signal enable signals. A first digital pixel includes a first photo detector, first memory cells storing a reset sampling value from the first photo detector, and second memory cells storing a signal sampling value from the first photo detector. A second digital pixel includes a second photo detector, third memory cells storing a reset sampling value from the second photo detector, and fourth memory cells storing a signal sampling value from the second photo detector. The first to fourth memory cells are connected with a plurality of bit lines. The first memory cells are connected with a first reset enable signal of the reset enable signals. The second memory cells are connected with a first signal enable signal of the signal enable signals. The third memory cells are connected with a second reset enable signal of the reset enable signals. The fourth memory cells are connected with a second signal enable signal of the signal enable signals. The high-speed scanner includes: (1) a first flip-flop that receives a clock signal and a read trigger signal and outputs the first reset enable signal, (2) a first dummy flip-flop that receives the clock signal and the first reset enable signal and outputs a first dummy signal, (3) a second flip-flop that receives the clock signal and the first dummy signal and outputs the first signal enable signal, (4) a second dummy flip-flop that receives the clock signal and the first signal enable signal and outputs a second dummy signal, (5) a third flip-flop that receives the clock signal and the second dummy signal and outputs the second reset enable signal, (6) a third dummy flip-flop that receives the clock signal and the second reset enable signal and outputs a third dummy signal, and (7) a fourth flip-flop that receives the clock signal and the third dummy signal and outputs the second signal enable signal.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art easily carries out the present disclosure.

Figure 1:
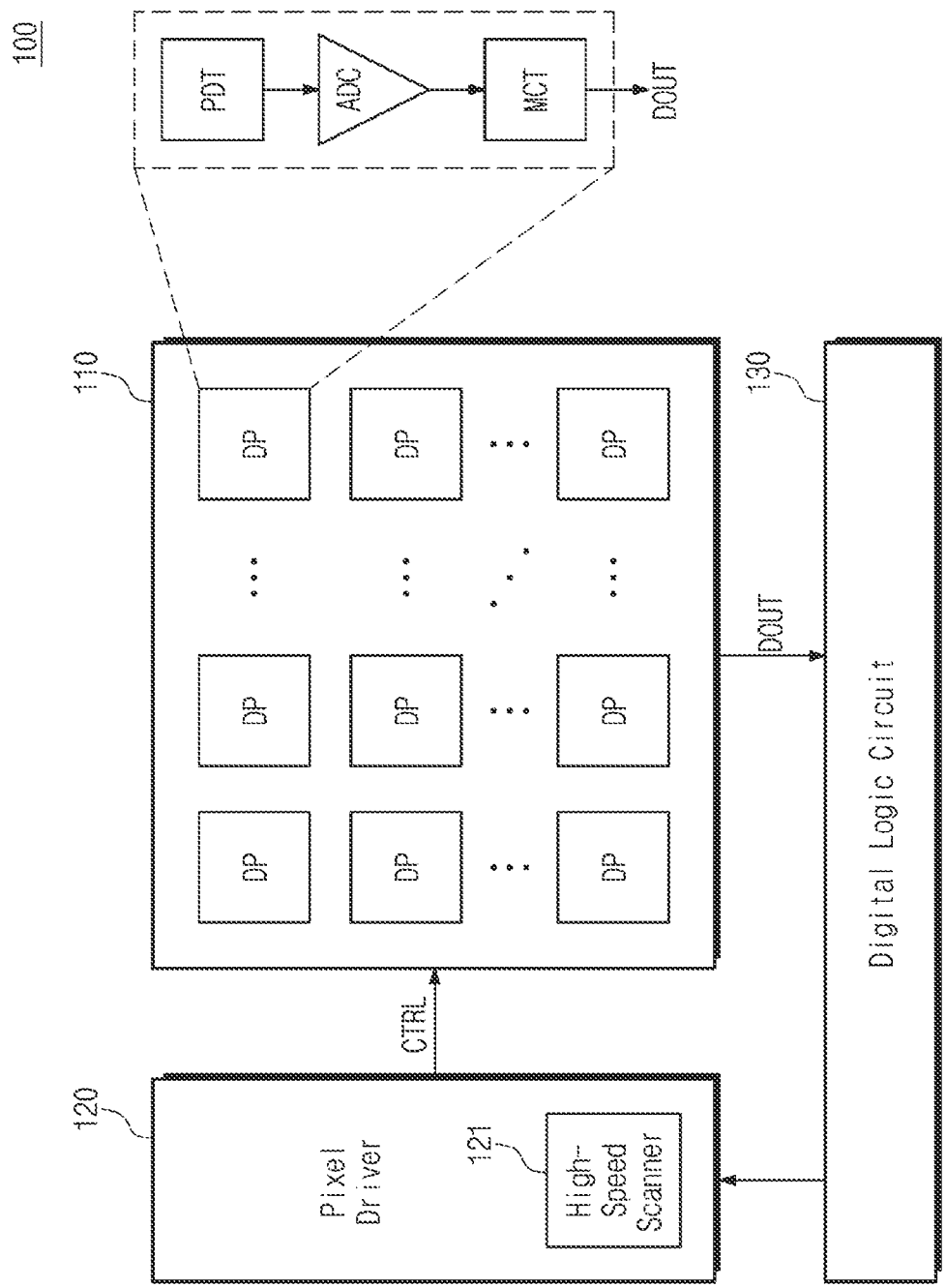
FIG. 1 is a block diagram illustrating an image sensor device according to an embodiment of the present disclosure.

FIG. 1 is a block diagram illustrating an image sensor device according to an embodiment of the present disclosure. Referring to FIG. 1, an image sensor device 100 may include a pixel array 110, a pixel driver 120, and a digital logic circuit 130. In an embodiment, the image sensor device 100 may be a camera module included in various electronic devices such as a closed-circuit television (CCTV), a black box, a digital camera, a smartphone, a tablet PC, and a notebook.

In a conventional CMOS image sensor (CIS), image pixels output analog signals based on a light signal. Analog signals from the CIS-based image pixels are converted into digital signals at separate analog-to-digital converters respectively disposed at columns. In this case, because noise or coupling occurs while the analog signals converted by the CIS-based image pixels are transferred to the analog-to-digital converters, the quality of a final image is reduced.

The pixel array 110 according to an embodiment of the present disclosure may include a plurality of digital pixels DP. Each of the digital pixels DP may be configured to sense a light signal from the outside and to output a digital signal DOUT corresponding to the sensed light signal.

For example, the digital pixel DP may include a photo detector PDT, an analog-to-digital converter ADC, and a memory circuit MCT. The photo detector PDT may be configured to convert a light signal sensed from the outside into an electrical signal, that is, an analog signal. The analog-to-digital converter ADC may be configured to convert the analog signal output from the photo detector PDT into a digital signal. The memory circuit MCT may be configured to store the digital signal DOUT converted by the analog-to-digital converter ADC and to output the stored digital signal DOUT. As described above, unlike a conventional CIS image pixel, the digital pixel DP according to an embodiment of the present disclosure may output the digital signal DOUT at a pixel level.

The pixel driver 120 may output various control signals CTRL (e.g., a photo detector control signal, a memory control signal, a ramp signal, and count information) for controlling the plurality of digital pixels DP included in the pixel array 110. Based on the control signal CTRL generated from the pixel driver 120, each of the plurality of digital pixels DP may perform a series of pixel operations or image detecting operations such as an operation of detecting a light signal to generate an analog signal, an operation of converting the analog signal into a digital signal, an operation of storing the digital signal, and an operation of outputting the stored digital signal.

In an embodiment, the pixel driver 120 may include a high-speed scanner 121. The high-speed scanner 121 may generate reset enable signals and signal enable signals to output the digital signal DOUT stored in the memory circuit MCT at high speed. The high-speed scanner 121 may provide the reset enable signals and the signal enable signals to the pixel array 110. The reset enable signals and the signal enable signals may be included in the control signal CTRL. A reset sampling value and a signal sampling value may be included in the digital signal DOUT.

The digital logic circuit 130 may perform digital signal processing on the digital signals DOUT received from the pixel array 110 and may provide a final image to an external device (e.g., an image signal processor (ISP) or an application processor (AP)). In an embodiment, the digital logic circuit 130 may provide a driving signal to the pixel driver 120 under control of the external device. The pixel driver 120 may operate in response to the driving signal.

As described above, unlike the conventional CIS device, each of the plurality of digital pixels DP according to an embodiment of the present disclosure may generate and output the digital signal DOUT at a pixel level. Accordingly, modification of the digital signals DOUT from the plurality of digital pixels DP may decrease, and an image signal may be processed at high speed.

Figure 2A:
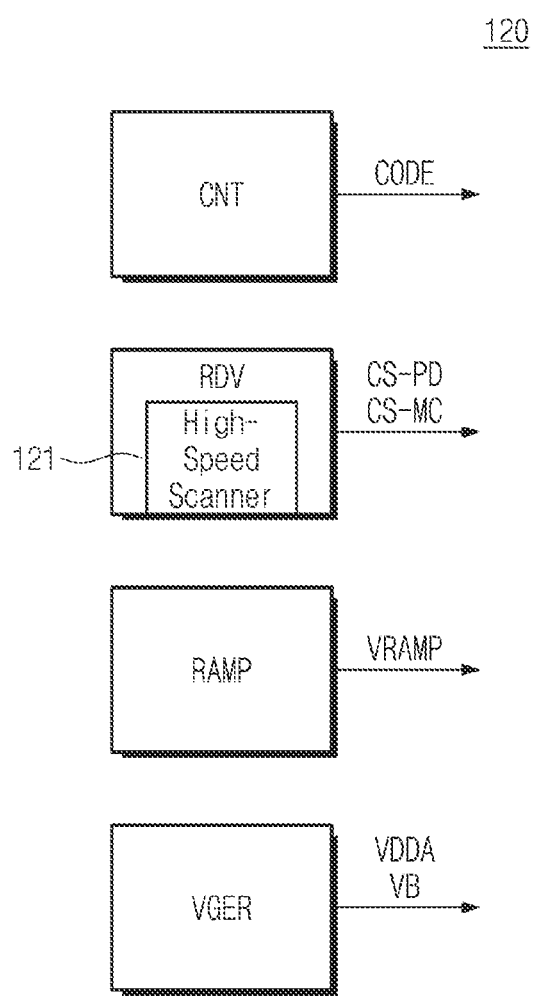
FIG. 2A is a block diagram illustrating a pixel driver of FIG. 1.

FIG. 2A is a block diagram illustrating a pixel driver of FIG. 1. Referring to FIGS. 1 and 2A, the pixel driver 120 may include a counter CNT, a row driver RDV, a ramp generator RAMP, and a voltage generator VGER.

The counter CNT may sequentially increase or sequentially decrease a value of a code "CODE" in response to a given clock (e.g., an operating clock or a system clock) during a given time. That is, a value of the code "CODE" may sequentially change over time.

The row driver RDV may generate a control signal for controlling each of the plurality of digital pixels DP. For example, the row driver RDV may generate a photo detector control signal CS-PD for controlling the photo detector PDT of each of the plurality of digital pixels DP. The row driver RDV may generate a memory control signal CS-MC for controlling the memory circuit MCT of each of the plurality of digital pixels DP.

In an embodiment, the row driver RDV may include the high-speed scanner 121. The high-speed scanner 121 may generate the reset enable signals and the signal enable signals such that a reset sampling value and a signal sampling value stored in the memory circuit MCT are output at high speed. The reset enable signals and the signal enable signals may be included in the memory control signal CS-MC.

The ramp generator RAMP may output a ramp signal VRAMP. The ramp signal VRAMP may be used as a reference signal targeted for comparison with an analog signal at the digital pixel DP. In an embodiment, the ramp signal VRAMP may be a uniformly increasing or decreasing signal (i.e., a signal increasing/decreasing with a single slope).

The voltage generator VGER may be configured to generate various voltages (e.g., a power supply voltage VDDA and a bias voltage VB) necessary for the image sensor device 100 to operate.

The photo detector control signal CS-PD, the memory control signal CS-MC, the code "CODE", and the ramp signal VRAMP may be included in the control signal CTRL described with reference to FIG. 1. In an embodiment, each of the plurality of digital pixels DP included in the pixel array 110 may operate based on various signals CODE, CS-PD, CS-MC, VRAMP, VDDA, and VB generated from the pixel driver 120 described with reference to FIG. 2A.

Figure 2B:
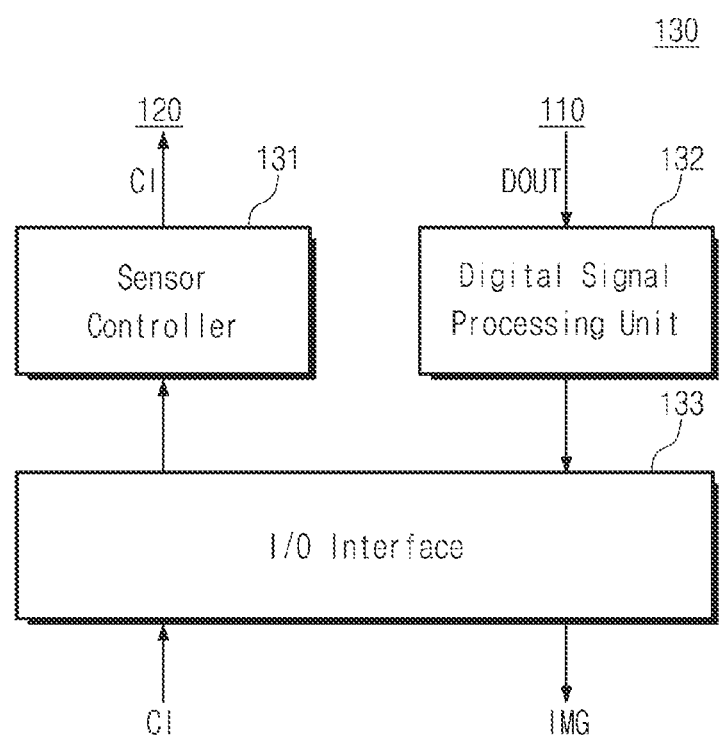
FIG. 2B is a block diagram illustrating a digital logic circuit of FIG. 1.

FIG. 2B is a block diagram illustrating a digital logic circuit of FIG. 1. Referring to FIGS. 1 and 2B, the digital logic circuit 130 includes a sensor controller 131, a digital signal processing unit 132, and an input/output interface 133.

The sensor controller 131 may be configured to control overall operations of the image sensor device 100. For example, the sensor controller 131 may control overall operations of the image sensor device 100 based on control information CI provided from the external device (e.g., an ISP or an AP) through the input/output interface 133. The sensor controller 131 may be a timing controller for controlling an operation timing of the pixel driver 120. In an embodiment, the pixel driver 120 may generate various signals described above, based on timing signals from the sensor controller 131.

In an embodiment, the sensor controller 131 may provide the high-speed scanner 121 with a clock signal, a cluster enable signal, a read trigger signal, etc. The clock signal, the cluster enable signal, the read trigger signal, etc. may be included in the control information CI.

The digital signal processing unit 132 may receive the digital signals DOUT from the pixel array 110 and may perform digital signal processing on the received digital signals DOUT.

In an embodiment, the digital signal DOUT output from one digital pixel DP of the pixel array 110 may include a reset sampling value and a signal sampling value. The digital signal processing unit 132 may determine a final digital value corresponding to a light signal sensed by one digital pixel DP by computing the reset sampling value and the signal sampling value.

Final image data IMG may be generated by combining final digital signals respectively determined by a plurality of digital pixels. That is, a correlated double sampling (CDS) operation may be implemented through the digital signal DOUT generated by an operation of a comparator or the analog-to-digital converter ADC included in the digital pixel DP and a digital signal processing operation of the digital signal processing unit 132 included in the digital logic circuit 130.

The input/output interface 133 may be configured to receive the control information CI from the external device (e.g., an ISP or an AP) or to output the final image data IMG. In an embodiment, the input/output interface 133 may exchange the above information with the external device in compliance with a given protocol. In an embodiment, the input/output interface 133 may include a physical layer for supporting the given protocol.

FIGS. 3A to 3F are diagrams for describing a digital pixel of FIG. 1 in more detail. Various structures of a digital pixel according to embodiments of the present disclosure will be described with reference to FIGS. 3A to 3D, but the present disclosure is not limited thereto. Also, to describe embodiments of the present disclosures easily, a structure or an operation of the digital pixel DP will be described with reference to an example circuit diagram or block diagram, but the present disclosures is not limited thereto. For example, the digital pixel DP may be modified in various forms.

Below, for brevity of drawing and for convenience of description, additional description associated with components the same as or similar to the above components will be omitted to avoid redundancy. Components that will be omitted below may be implemented through each of embodiments disclosed in the detailed description or through a combination thereof.

Referring to FIGS. 1, 2, and 3A to 3E, the digital pixel DP may include the photo detector PDT, a comparator COMP, and the memory circuit MCT. The photo detector PDT may be configured to output a detection signal DET in response to the photo detector control signal CS-PD from the pixel driver 120.

Figure 3A:
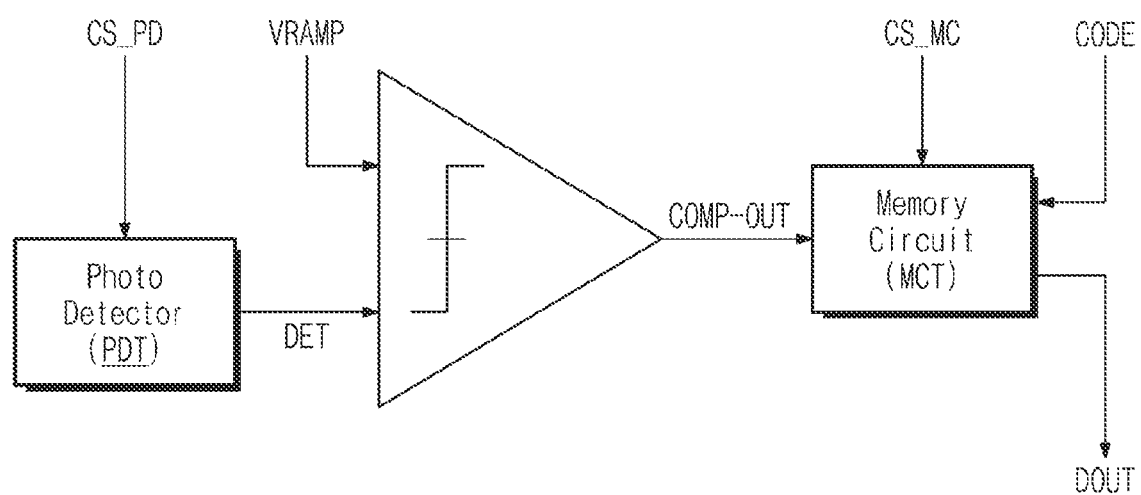
FIGS. 3A to 3F are diagrams for describing a digital pixel of FIG. 1 in more detail.
Figure 3B:
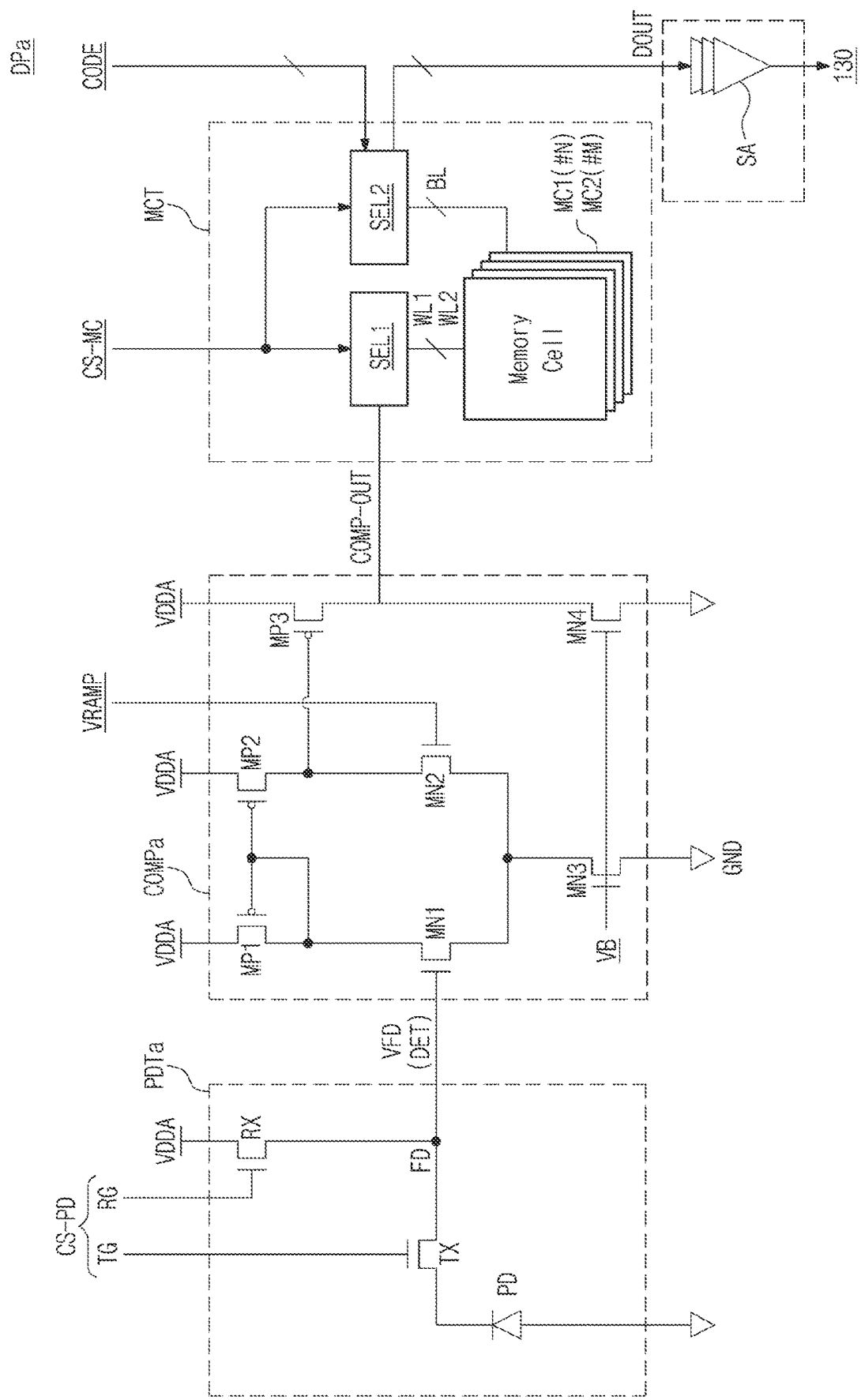

For example, referring to FIG. 3B, a digital pixel DPa may include a photo detector PDTa, a comparator COMPa, and the memory circuit MCT. As illustrated in FIG. 3B, the photo detector PDTa may include a photo diode PD, a transfer transistor TX, and a reset transistor RX. The photo diode PD may be connected between a ground node and the transfer transistor TX and may be configured to integrate photo charges in response to a magnitude of a light incident from the outside. The transfer transistor TX may be connected between a floating diffusion node FD and the photo diode PD and may operate in response to a transfer signal TG. For example, the transfer transistor TX may be configured to transfer the charges integrated at the photo diode PD to the floating diffusion node FD in response to the transfer signal TG. The reset transistor RX may be connected between the power supply voltage VDDA and the floating diffusion node FD and may operate in response to a reset signal RG. For example, the reset transistor RX may reset a voltage level of the floating diffusion node FD in response to the reset signal RG. In an embodiment, the pixel control signal CS-PD may include the transfer signal TG and the reset signal RG described above. In an embodiment, depending on an operation of the photo detector PDTa, a voltage (i.e., VFD) of the floating diffusion node FD may change, and this change may be output as the detection signal DET.

The comparator COMPa may compare the detection signal DET (or the voltage VFD of the floating diffusion node FD) from the photo detector PDTa and the ramp signal VRAMP and may output a comparison signal COMP-OUT based on a comparison result.

In an embodiment, the comparator COMPa may be implemented with a low-power comparator. For example, as illustrated in FIG. 3B, the comparator COMPa may include first to third PMOS transistors MP1 to MP3 and first to fourth NMOS transistors MN1 to MN4. The first PMOS transistor MP1, the first NMOS transistor MN1, and the third NMOS transistor MN3 may be connected in series between the power supply voltage VDDA and a ground voltage GND. A gate of the first PMOS transistor MP1 may be connected to a node between the first PMOS transistor MP1 and the first NMOS transistor MN1. A gate of the first NMOS transistor MN1 may be connected with the floating diffusion node FD and may be configured to receive the detection signal DET. A gate of the third NMOS transistor MN3 may be configured to receive the bias voltage VB. The second PMOS transistor MP2 and the second NMOS transistor MN2 may be connected in series between the power supply voltage VDDA and a first end of the third NMOS transistor MN3. A gate of the second PMOS transistor MP2 may be connected with the gate of the first PMOS transistor MP1. A gate of the second NMOS transistor MN2 may be configured to receive the ramp signal VRAMP. The third PMOS transistor MP3 and the fourth NMOS transistor MN4 may be connected in series between the power supply voltage VDDA and the ground voltage GND. A gate of the third PMOS transistor MP3 may be connected to a node between the second PMOS transistor MP2 and the second NMOS transistor MN2. A gate of the fourth NMOS transistor MN4 may be configured to receive the bias voltage VB.

In the comparator COMPa illustrated in FIG. 3B, when the detection signal DET is lower than the ramp signal VRAMP, the comparison signal COMP-OUT may have a level of logic high; when the detection signal DET is higher than the ramp signal VRAMP, the comparison signal COMP-OUT may have a level of logic low.

In an embodiment, the structure of the comparator COMPa of FIG. 3B is an example, and the present disclosure is not limited thereto. The comparator COMPa may have structures of various types of comparators or differential amplifiers configured to compare the detection signal DET and the ramp signal VRAMP and to output the comparison signal COMP-OUT based on a comparison result.

The memory circuit MCT may be configured to store the code "CODE" in response to the comparison signal COMP-OUT and the memory control signal CS-MC or to output the stored code "CODE" as the digital signal DOUT in response to the comparison signal CMP_OUT and the memory control signal CS_MC. For example, as illustrated in FIG. 3B, the memory circuit MCT may include first and second selection circuits SEL1 and SEL2 and a plurality of memory cells MC1 and MC2.

Each of the plurality of memory cells MC1 and MC2 may be one of various types of data storage elements, which are configured to store the code "CODE" at a specific timing, such as a DRAM cell, an SDRAM cell, and a latch. The plurality of memory cells MC1 and MC2 may be connected with first and second word lines WL1 and WL2 and bit lines BL. Depending on levels of the first and second word lines WL1 and WL2, the plurality of memory cells MC1 and MC2 may store the code "CODE" provided through the bit lines BL or may output the stored code "CODE" through the bit lines BL as the digital signal DOUT.

In an embodiment, the number of first memory cells MC1 among the plurality of memory cells MC1 and MC2 may be "N" (N being a natural number of 2 or more), and the number of second memory cells MC2 among the plurality of memory cells MC1 and MC2 may be "M" (M being a natural number). In an embodiment, the number "N" of first memory cells MC1 may be equal to or different from the number "M" of second memory cells MC2.

In an embodiment, the first memory cells MC1 may be configured to store a reset sampling value "R", and the second memory cells MC2 may be configured to store a signal sampling value "S". The first memory cells MC1 may be connected with the first word line WL1 and the bit lines BL, and the second memory cells MC2 may be connected with the second word line WL2 and the bit lines BL.

Figure 3C:
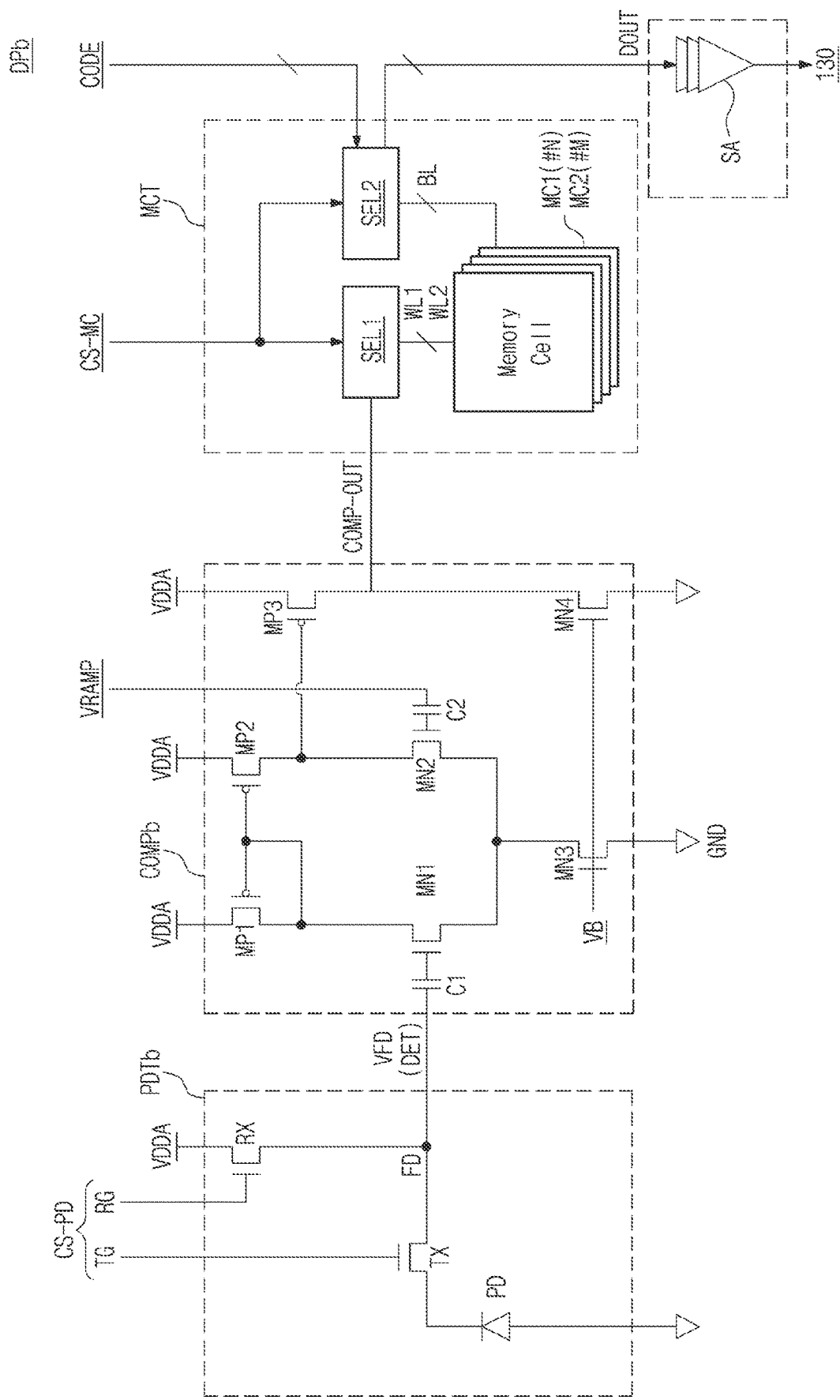

Referring to FIG. 3C, a digital pixel DPb may include a photo detector PDTb, a comparator COMPb, and the memory circuit MCT. The comparator COMPb may include a first capacitor C1 connected between the floating diffusion node FD and the first NMOS transistor MN1. The comparator COMPb may further include a second capacitor C2 connected between the second NMOS transistor MN2 and the ramp signal VRAMP.

The first and second capacitors C1 and C2 may include a passive element, a metal oxide semiconductor (MOS) transistor, a metal insulator metal (MIM) capacitor, a cell capacitor, etc. The remaining components and operations thereof are similar to the components and operations described above, and thus, additional description will be omitted to avoid redundancy.

Figure 3D:
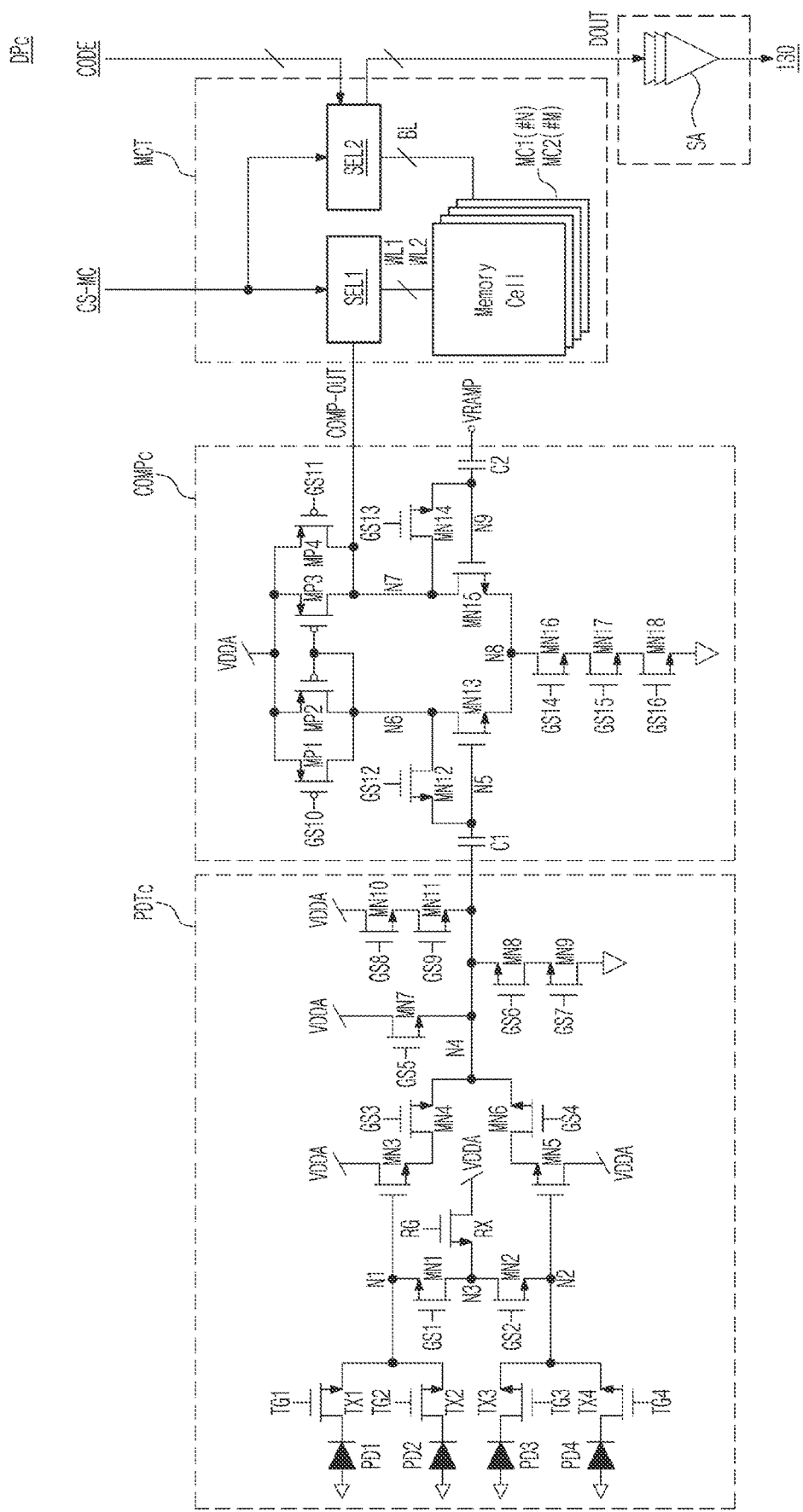

Referring to FIG. 3D, a digital pixel DPc may include a photo detector PDTc, a comparator COMPc, and the memory circuit MCT. The photo detector PDTc may include first to fourth photo diodes PD1 to PD4, first to fourth transfer transistors TX1 to TX4, the reset transistor RX, and first to eleventh NMOS transistors MN1 to MN11. The first to fourth photo diodes PD1 to PD4 may be connected between the ground node and the first to fourth transfer transistors TX1 to TX4, and may be configured to integrate photo charges in response to a magnitude of a light incident from the outside. For example, the first photo diode PD1 may be connected between the ground node and the first transfer transistor TX1. The remaining photo diodes PD2 to PD4 are similar to the first photo diode PD1, and thus, additional description will be omitted to avoid redundancy.

The first transfer transistor TX1 may be connected between the first photo diode PD1 and a first node N1. The second transfer transistor TX2 may be connected between the second photo diode PD2 and the first node N1. The third transfer transistor TX3 may be connected between the third photo diode PD3 and a second node N2. The fourth transfer transistor TX4 may be connected between the fourth photo diode PD4 and the second node N2.

Gates of the first to fourth transfer transistors TX1 to TX4 may be connected to receive corresponding transfer signals TG1 to TG4, respectively. For example, the gate of the first transfer transistor TX1 may be connected to receive the first transfer signal TG1. The remaining transfer transistors TX2 to TX4 are similar to the first transfer transistor TX1, and thus, additional description will be omitted to avoid redundancy.

The reset transistor RX may be connected between the power supply voltage VDDA and a third node N3 and may operate in response to the reset signal RG. The first NMOS transistor MN1 may be connected between the first node N1 and the third node N3 and may operate in response to a first gate signal GS1. The second NMOS transistor MN2 may be connected between the second node N2 and the third node N3 and may operate in response to a second gate signal GS2.

In an embodiment, the photo detector PDTc may include a source follower (SF) amplifier. The SF amplifier may include the third to sixth NMOS transistors MN3 to MN6. The third NMOS transistor MN3 and the fourth NMOS transistor MN4 may be connected in series between the power supply voltage VDDA and a fourth node N4. A gate of the third NMOS transistor MN3 may be connected with the first node N1. The fourth NMOS transistor MN4 may operate in response to a third gate signal GS3. The fifth NMOS transistor MN5 and the sixth NMOS transistor MN6 may be connected in series between the power supply voltage VDDA and the fourth node N4. A gate of the fifth NMOS transistor MN5 may be connected with the second node N2. The sixth NMOS transistor MN6 may operate in response to a fourth gate signal GS4.

The seventh NMOS transistor MN7 may be connected between the power supply voltage VDDA and the fourth node N4 and may operate in response to a fifth gate signal GS5. The eighth and ninth NMOS transistors MN8 and MN9 may be connected in series between the fourth node N4 and the ground node. The eighth NMOS transistor MN8 may operate in response to a sixth gate signal GS6. The ninth NMOS transistor MN9 may operate in response to a seventh gate signal GS7.

The tenth and eleventh NMOS transistors MN10 and MN11 may be connected in serial between the power supply voltage VDDA and the fourth node N4. The tenth NMOS transistor MN10 may operate in response to an eighth gate signal GS8, and the eleventh NMOS transistor MN11 may operate in response to a ninth gate signal GS9.

The comparator COMPc may include first to fourth PMOS transistors MP1 to MP4, twelfth to eighteenth NMOS transistors MN12 to MN18, and the first and second capacitors C1 and C2. The first capacitor C1 may be connected between the fourth node N4 and a fifth node N5. The second capacitor C2 may be connected between a ninth node N9 and the ramp signal VRAMP. The first and second capacitors C1 and C2 may include a passive element, a metal oxide semiconductor (MOS) transistor, a metal insulator metal (MIM) capacitor, a cell capacitor, etc.

The first PMOS transistor MP1 may be connected between the power supply voltage VDDA and a sixth node N6 and may operate in response to a tenth gate signal GS10. The second PMOS transistor MP2 may be connected between the power supply voltage VDDA and the sixth node N6. A gate of the second PMOS transistor MP2 may be connected with the sixth node N6.

The third PMOS transistor MP3 may be connected between the power supply voltage VDDA and a seventh node N7. A gate of the third PMOS transistor MP3 may be connected with the gate of the second PMOS transistor MP2. The fourth PMOS transistor MP4 may be connected between the power supply voltage VDDA and the seventh node N7 and may operate in response to an eleventh gate signal GS11.

The twelfth NMOS transistor MN12 may be connected between the sixth node N6 and the fifth node N5 and may operate in response to a twelfth gate signal GS12. The thirteenth NMOS transistor MN13 may be connected between the sixth node N6 and an eighth node N8. A gate of the thirteenth NMOS transistor MN13 may be connected with the fifth node N5.

The fourteenth NMOS transistor MN14 may be connected between the seventh node N7 and the ninth node N9 and may operate in response to a thirteenth gate signal GS13. The fifteenth NMOS transistor MN15 may be connected between the seventh node N7 and the eighth node N8. A gate of the fifteenth NMOS transistor MN15 may be connected to the ninth node N9.

The sixteenth to eighteenth NMOS transistors MN16 to MN18 may be connected in series between the eighth node N8 and the ground node. The sixteenth NMOS transistor MN16 may operate in response to a fourteenth gate signal GS14, the seventeenth NMOS transistor MN17 may operate in response to a fifteenth gate signal GS15, and the eighteenth NMOS transistor MN18 may operate in response to a sixteenth gate signal GS16.

The comparator COMPc may output a voltage of the seventh node N7 to the memory circuit MCT as the comparison signal COMP-OUT. The remaining components and operations thereof are similar to the components and operations described above, and thus, additional description will be omitted to avoid redundancy.

Figure 3E:
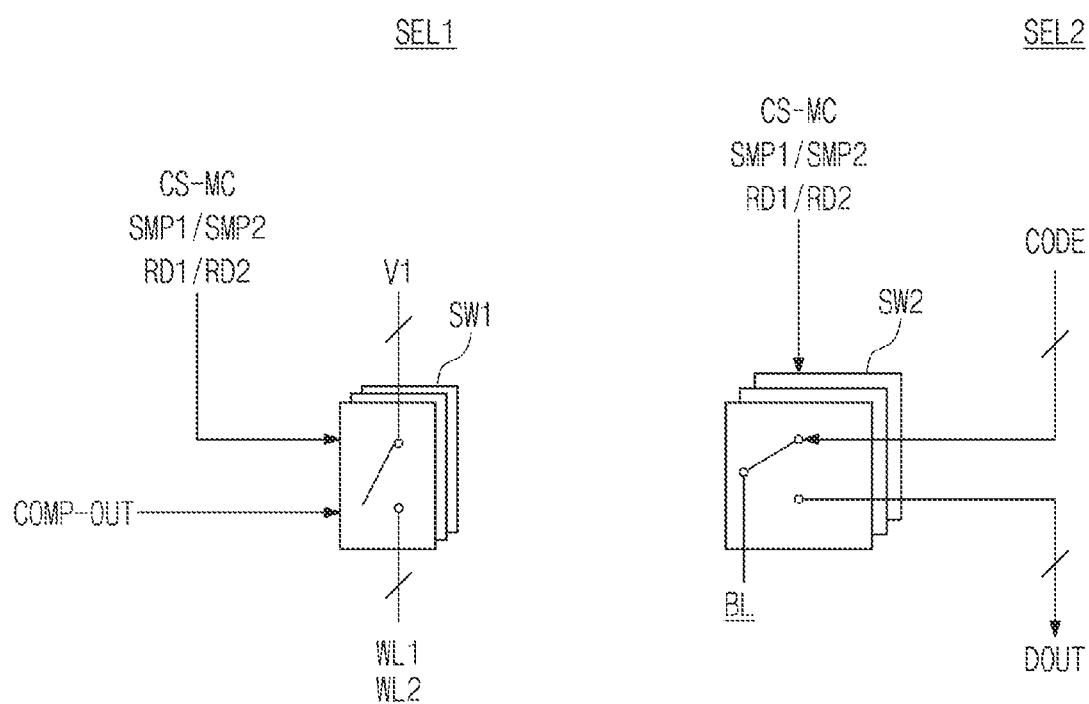

The first selection circuit SEL1 may be configured to control the first and second word lines WL1 and WL2 in response to the comparison signal COMP-OUT and the memory control signal CS-MC. For example, as illustrated in FIG. 3E, the first selection circuit SEL1 may include first switches SW1. Each of the first switches SW1 may be configured to provide a first voltage V1 to one of the first word lines WL1 and the second word lines WL2 in response to the comparison signal COMP-OUT and the memory control signal CS-MC. In an embodiment, the first voltage V1 may be a high voltage enough to enable each of the plurality of memory cells MC1 and MC2 (e.g., a high voltage for enabling a selection transistor in the case where memory cells are DRAM cells).

For example, the memory control signal CS-MC may include first and second sampling signals SMP1 and SMP2 and first and second read signals RD1 and RD2. The first sampling signal SMP1 may be a signal for storing the reset sampling value "R" in the first memory cells MC1, and the second sampling signal SMP2 may be a signal for storing the signal sampling signal "S" in the second memory cells MC2. The first read signal RD1 may be a signal for outputting the reset sampling signal "R" stored in the first memory cells MC1 as the digital signal DOUT, and the second read signal RD2 may be a signal for outputting the signal sampling signal "S" stored in the second memory cells MC2 as the digital signal DOUT. However, the present disclosure is not limited thereto. For example, the memory control signal CS-MC for controlling the memory circuit MCT may be variously changed or modified.

In the case where the first sampling signal SMP1 or the first read signal RD1 is enabled, the first switches SW1 may provide the first voltage V1 to the first word line WL1 in response to a falling edge (or a rising edge) of the comparison signal COMP-OUT. As such, the first memory cells MC1 connected with the first word line WL1 may be enabled. In this case, a value of the code "CODE" may be stored in the first memory cells MC1 thus enabled, or a value (e.g., the reset sampling value "R") stored in the first memory cells MC1 thus enabled may be output.

In the case where the second sampling signal SMP2 or the second read signal RD2 is enabled, the first switches SW1 may provide the first voltage V1 to the second word line WL2 in response to the falling edge (or the rising edge) of the comparison signal COMP-OUT. As such, the second memory cells MC2 connected with the second word line WL2 may be enabled. In this case, a value of the code "CODE" may be stored in the second memory cells MC2 thus enabled, or a value (e.g., the signal sampling value "S") stored in the second memory cells MC2 thus enabled may be output.

As described above, the first selection circuit SEL1 may select at least one of a group of first memory cells MC1 and a group of second memory cells MC2 in response to the comparison signal COMP-OUT and the memory control signal CS-MC.

In response to the memory control signal CS-MC, the second selection circuit SEL2 may be configured to provide the code "CODE" to the bit lines BL or to output the digital signal DOUT from the bit lines BL. For example, as illustrated in FIG. 3E, the second selection circuit SEL2 may include second switches SW2. In response to the memory control signal CS-MC, the second switches SW2 may be configured to connect the bit lines BL with one of a group of lines for receiving the code "CODE" and a group of lines for outputting the digital signal DOUT.

For example, in the case where the first sampling signal SMP1 or the second sampling signal SMP2 is enabled, the second switches SW2 may connect the bit lines BL with the lines for receiving the code "CODE". In this case, the code "CODE" provided from the counter CNT may be provided to the first memory cells MC1 or the second memory cells MC2 through the bit lines BL. In the case where the first read signal RD1 or the second read signal RD2 is enabled, the second switches SW2 may connect the bit lines BL with the lines for outputting the digital signal DOUT. In this case, the value (e.g., the reset sampling value "R" or the signal sampling value "S") stored in the first memory cells MC1 or the second memory cells MC2 may be output as the digital signal DOUT.

In an embodiment, the first selection circuit SEL1 and the second selection circuit SEL2 illustrated in FIG. 3E is an example, and the present disclosure is not limited thereto. For example, each of the first and second selection circuits SEL1 and SEL2 may be variously changed or modified to store or read information (e.g., the reset sampling value "R" or the signal sampling value "S") corresponding to memory cells corresponding to the digital pixel DP. In an embodiment, each of the first and second selection circuits SEL1 and SEL2 may be variously modified depending on the number of word lines, the number of bit lines, a way to route word lines, and a way to route bit lines. An example embodiment is illustrated as the first and second selection circuits SEL1 and SEL2 are included in one digital pixel DP, but the present disclosure is not limited thereto. For example, the first and second selection circuits SEL1 and SEL2 may be disposed in units of a pixel group including a plurality of digital pixels.

As described above, the digital pixel DP according to an embodiment of the present disclosure may be configured to generate an analog signal corresponding to a light received from the outside, to convert the generated analog signal into a digital signal, and to output the digital signal. Below, a schematic operation of the digital pixel DP will be described with reference to FIG. 3F.

Figure 3F:
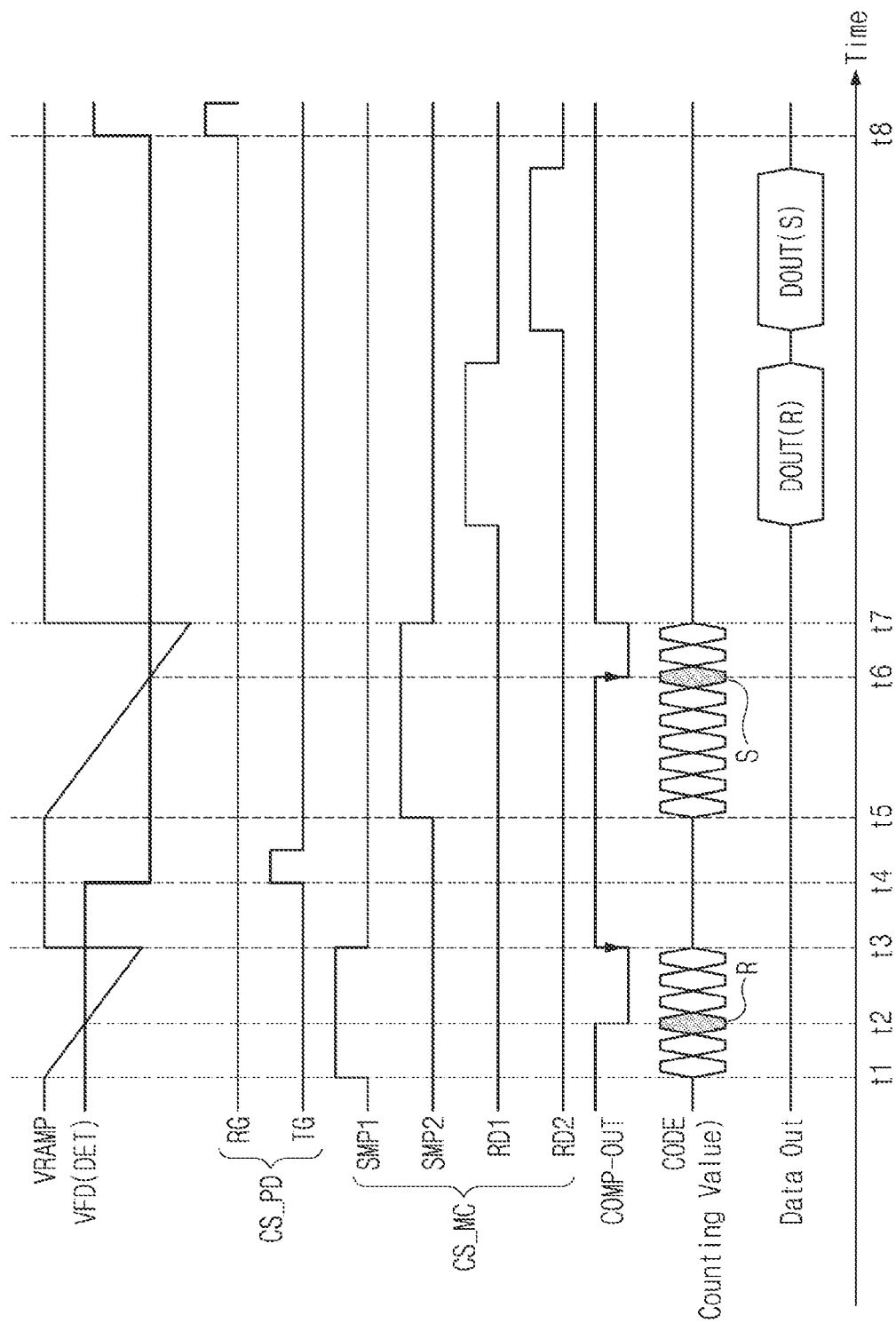

As illustrated in FIG. 3F, the first sampling signal SMP1 may be enabled from a first time t1 to a third time t3. That is, during a time interval from the first time t1 to the third time t3, a sampling operation may be performed on a reset level of the photo detector PDT.

For example, during the enable of the first sampling signal SMP1, the ramp generator RAMP may output the ramp signal VRAMP that uniformly decreases (i.e., decreases at a single slope), and the counter CNT may sequentially output the increasing or decreasing code "CODE" at a given interval. At a second time t2, a level of the ramp signal VRAMP may become smaller than a level (i.e., VFD) of the floating diffusion node FD of the photo detector PDT. In this case, the output signal COMP-OUT of the comparator COMP may transition from a high level to a low level.

Because the first sampling signal SMP1 is in an active state at a falling edge of the output signal COMP-OUT of the comparator COMP (i.e., at the second time t2), the code "CODE" may be provided to the bit lines BL by the second selection circuit SEL2, and the first memory cells MC1 may be enabled by the first selection circuit SEL1. That is, a value of the code "CODE" at the second time t2 may be stored in the first memory cells MC1 as the reset sampling value "R".

Afterwards, the transfer transistor TX of the photo detector PDT may be turned on in response to the transfer signal TG enabled at a fourth time t4, and thus, charges integrated by the photo diode PD may be transferred to the floating diffusion node FD. As such, at the fourth time t4, a level (i.e., VFD) of the floating diffusion node FD (or a level of the detection signal DET) may decrease as much as a level corresponding to the transferred charges.

Afterwards, the second sampling signal SMP2 may be enabled from a fifth time t5 to a seventh time t7. That is, during a time interval from the fifth time t5 to the seventh time t7, a signal sampling operation may be performed on the detection signal DET from the photo detector PDT.

As in the above description, for example, during the enable of the second sampling signal SMP2, the ramp signal generator RAMP may output the ramp signal VRAMP, and the counter CNT may output the code "CODE". At a sixth time t6, the detection signal DET may become lower than the ramp signal VRAMP. In this case, the output signal COMP-OUT of the comparator COMP may transition from the high level to the low level.

Because the second sampling signal SMP2 is in an active state at a falling edge of the output signal COMP-OUT of the comparator COMP (i.e., at the sixth time t6), the code "CODE" may be provided to the bit lines BL by the second selection circuit SEL2, and the second memory cells MC2 may be enabled by the second selection circuit SEL2. That is, a value "S" of the code "CODE" may be stored in the second memory cells MC2 at the sixth time t6.

Afterwards, during an enable period of the first read signal RD1, the first memory cells MC1 may be enabled by the first selection circuit SEL1, and the bit lines BL may be connected with output signal lines (i.e., a line for outputting the digital signal DOUT) by the second selection circuit SEL2. In this case, the value (i.e., the reset sampling value "R") stored in the first memory cells MC1 may be output as the digital signal DOUT.

Afterwards, during an enable period of the second read signal RD2, the second memory cells MC2 may be enabled by the second selection circuit SEL2, and the bit lines BL may be connected with the output signal lines by the second selection circuit SEL2. In this case, the value (i.e., the signal sampling value "S") stored in the second memory cells MC2 may be output as the digital signal DOUT.

Afterwards, at an eighth time t8, the reset transistor RX may be turned on in response to the enable of the reset signal RG, and thus, the level VFD of the floating diffusion node FD may be reset.

In an embodiment, the digital signal DOUT (or the reset sampling value "R" and the signal sampling value "S") output from the memory circuit MCT may be provided to the digital logic circuit 130 through a sense amplifier SA. In an embodiment, the sense amplifier SA may be disposed for each of columns of a plurality of pixels included in the pixel array 110.

The structure or operation of the digital pixel DP described with reference to FIGS. 3A to 3F is an example, and the present disclosure is not limited thereto. The structure or operation of the digital pixel DP may be variously changed depending on a way to implement the digital pixel DP.

Figure 4:
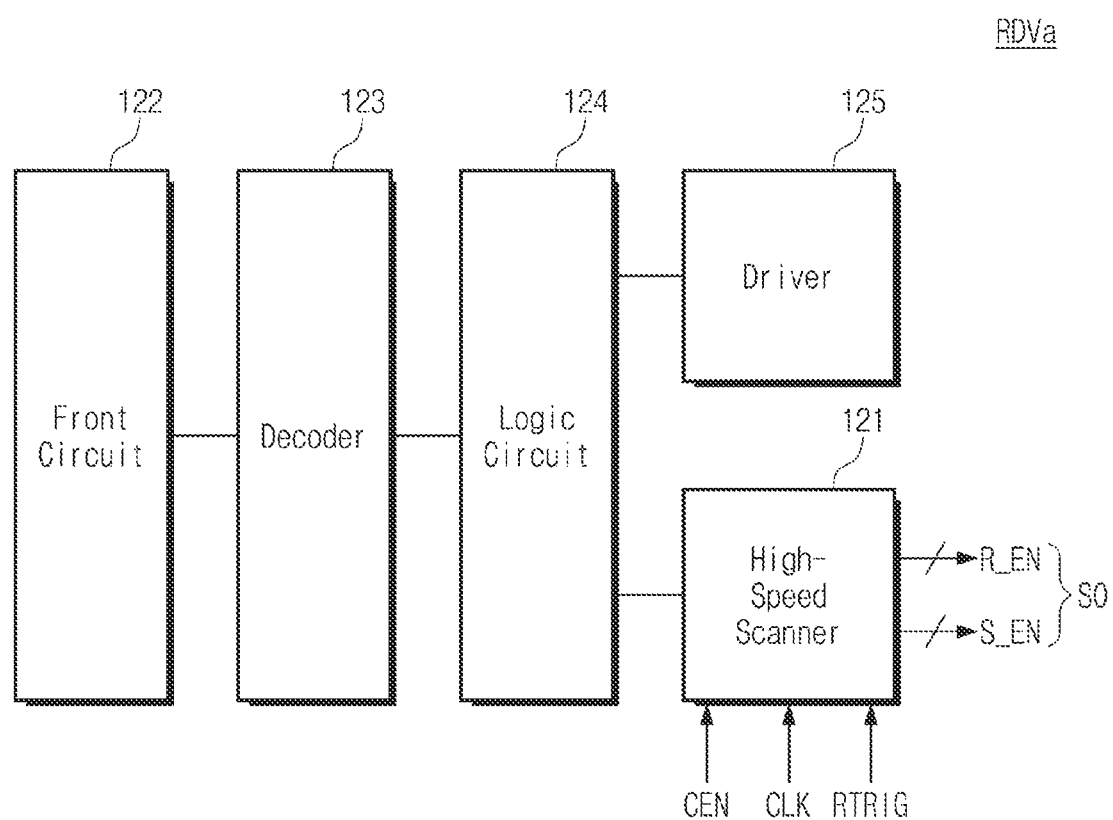
FIG. 4 is a block diagram illustrating a row driver of FIG. 2A.

FIG. 4 is a block diagram illustrating a row driver of FIG. 2A. Referring to FIGS. 2A and 4, a row driver RDVa may include the high-speed scanner 121, a front circuit 122, a decoder 123, a logic circuit 124, and a driver 125. The row driver RDVa may generate a control signal for controlling each of the plurality of digital pixels DP.

The front circuit 122 may receive the driving signal from the sensor controller 131. The front circuit 122 may control or adjust the received driving signal so as to be provided to each component of the row driver RDVa. For example, the front circuit 122 may be configured to perform a retiming operation such that the driving signal received from the sensor controller 131 is realigned.

The decoder 123 may decode signals received from the front circuit 122 or the sensor controller 131 to generate an enable signal for selecting rows to be enabled. Because the decoder 123 performs various operations compared to the high-speed scanner 121, it may be difficult to switch a plurality of rows at high speed. For example, a minimum time of 800 ns may be necessary for row switching.

The logic circuit 124 may output various control signals for controlling the digital pixels DP to the driver 125, based on signals received from the front circuit 122, the decoder 123, and the sensor controller 131.

The driver 125 may be connected with the logic circuit 124. The driver 125 may convert a voltage level of signals provided from the logic circuit 124 into a voltage level that the pixel array 110 is capable of processing. For example, the driver 125 may convert a voltage level of a signal swinging between a low voltage and a ground voltage into a voltage level of a signal swinging between a high voltage and the ground voltage. The driver 125 may provide signals of the converted voltage level to the pixel array 110.

The high-speed scanner 121 may receive a clock signal CLK, cluster enable signals CEN, and a read trigger signal RTRIG from the sensor controller 131. Alternatively, the high-speed scanner 121 may receive the cluster enable signals CEN and the read trigger signal RTRIG from the logic circuit 124. The high-speed scanner 121 may output reset enable signals R_EN and signal enable signals S_EN. The read trigger signal RTRIG may be a signal for generating the reset enable signals R_EN and the signal enable signals S_EN. The read trigger signal RTRIG may be a signal for starting or initiating a digital signal (DOUT) output operation at a cluster CL of FIG. 5A.

The high-speed scanner 121 may output the reset enable signals R_EN and the signal enable signals S_EN in response to the read trigger signal RTRIG. The reset enable signals R_EN and the signal enable signals S_EN may be collectively referred to as "scanner output signals SO".

The high-speed scanner 121 may provide the reset enable signals R_EN and the signal enable signals S_EN such that the reset sampling values "R" and the signal sampling values "S" are output at high speed. That is, to sequentially or randomly select a plurality of rows, the high-speed scanner 121 may provide the reset enable signals R_EN and the signal enable signals S_EN to the pixel array 110. For example, the high-speed scanner 121 may require a minimum time of 200 ns to switch a row to be enabled in the pixel array 110.

The reset enable signals R_EN and the signal enable signals S_EN may be included in the memory control signal CS-MC described with reference to FIG. 2A. The reset enable signals R_EN may correspond to the first read signal RD1 of FIG. 3E, and the signal enable signals S_EN may correspond to the second read signal RD2 of FIG. 3E.

That is, the image sensor device 100 using a digital pixel may store the reset sampling values "R" and the signal sampling values "S" in memory cells and may output the reset sampling values "R" and the signal sampling values "S" stored in memory cells to the digital signal processing unit 132. Accordingly, rows may be selected or switched at high speed in the digital signal output operation where the reset sampling values "R" and the signal sampling values "S" are output, and thus, performance of the digital signal output operation may be improved. Accordingly, the image sensor device 100 having improved performance is provided. An operation of the high-speed scanner 121 will be more fully described with reference to the following drawings.

Figure 5A:
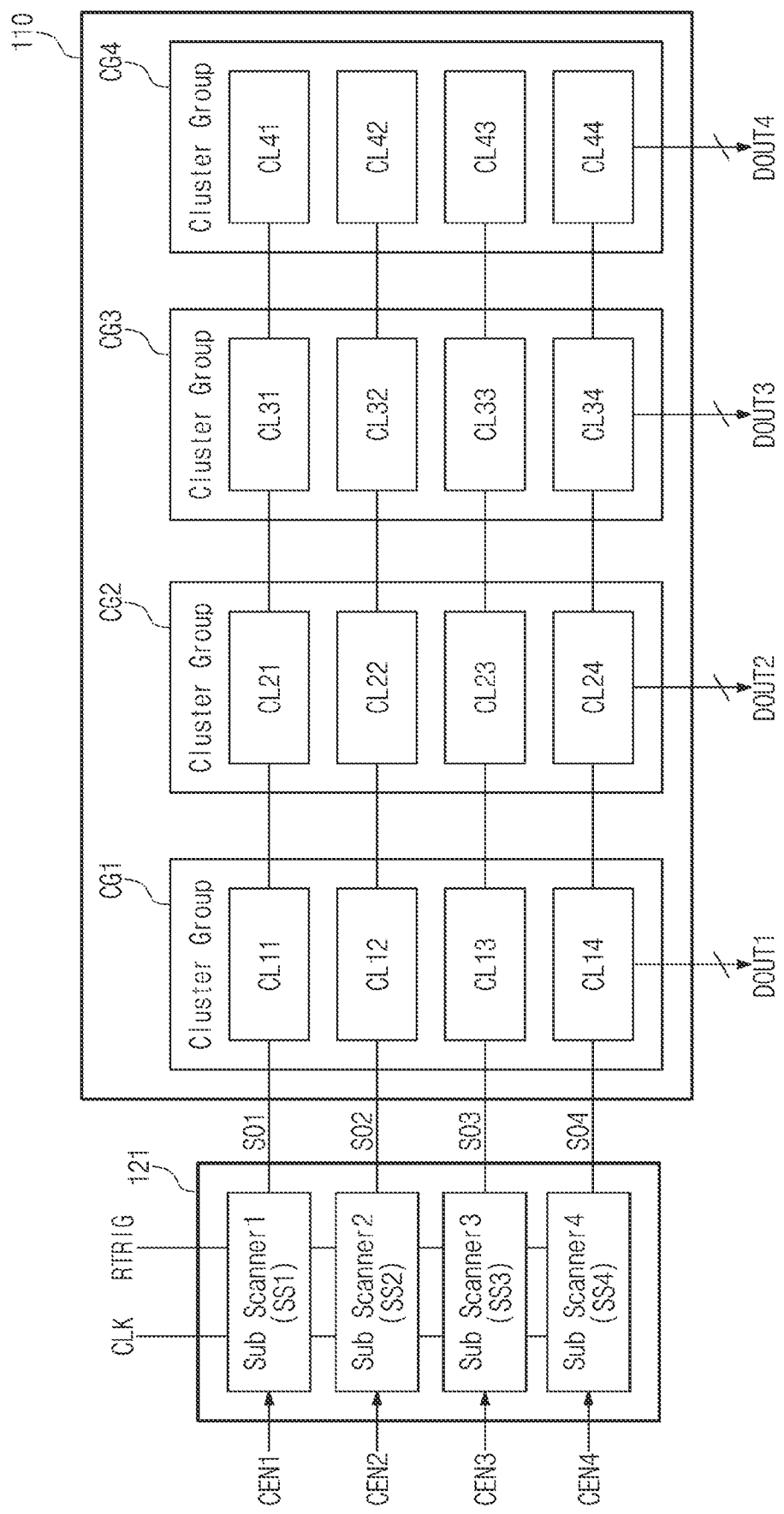
FIG. 5A is a block diagram illustrating a pixel array and a high-speed scanner of FIG. 1.
Figure 5B:
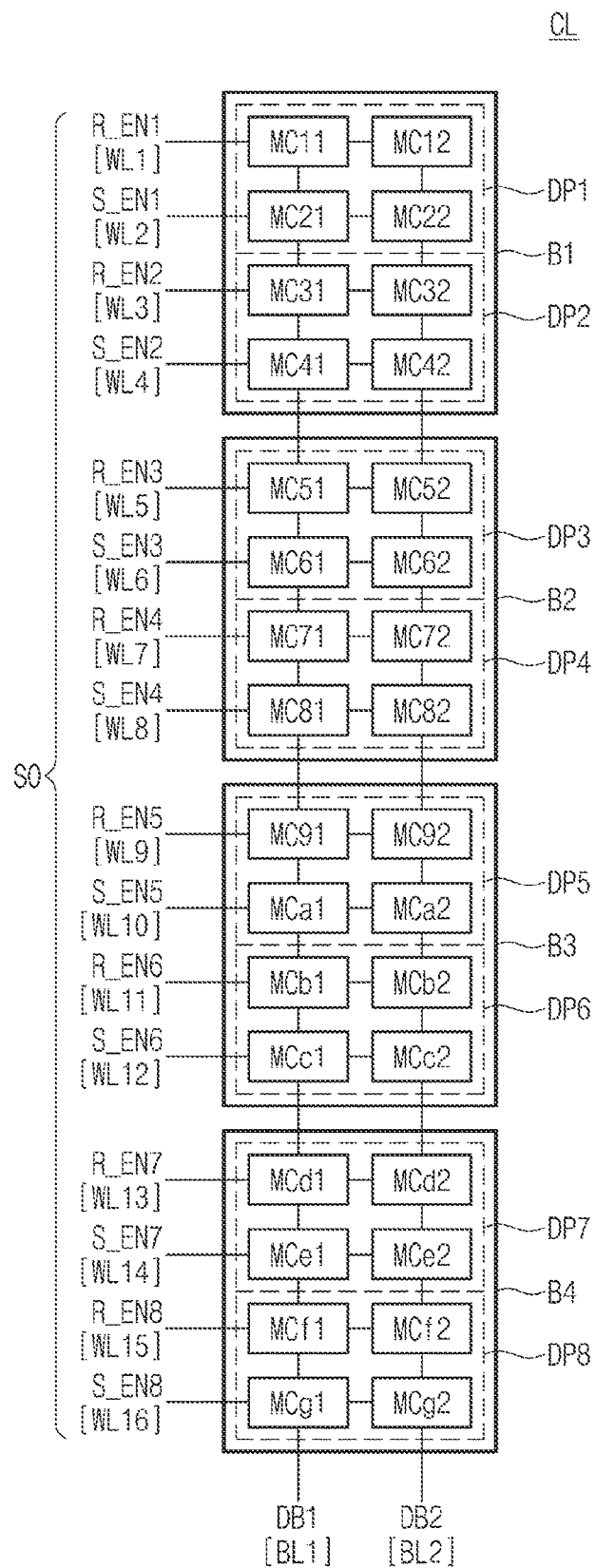
FIG. 5B is a block diagram illustrating a cluster of FIG. 5A.

FIG. 5A is a block diagram illustrating a pixel array and a high-speed scanner of FIG. 1. FIG. 5B is a block diagram illustrating a cluster of FIG. 5A. For brevity of drawing, components unnecessary to describe are omitted. In the embodiment of FIGS. 5A and 5B, only memory cells of the digital pixels DP are illustrated.

Referring to FIGS. 1, 4, 5A, and 5B, the pixel array 110 may include a plurality of cluster groups CG1 to CG4. Each of the plurality of cluster groups CG1 to CG4 may include a plurality of clusters. For example, the first cluster group CG1 may include a first part CL11 to CL14 of the plurality of clusters, the second cluster group CG2 may include a second part CL21 to CL24 of the plurality of clusters, the third cluster group CG3 may include a third part CL31 to CL34 of the plurality of clusters, and the fourth cluster group CG4 may include a fourth part CL41 to CL44 of the plurality of clusters. However, the present disclosure is not limited thereto. For example, the number of cluster groups and the number of clusters included in one cluster group may increase or decrease depending on a way to implement.

Each of the plurality of cluster groups CG1 to CG4 may output digital signals. For example, the first cluster group CG1 may output first digital signals DOUT1, the second cluster group CG2 may output second digital signals DOUT2, the third cluster group CG3 may output third digital signals DOUT3, and the fourth cluster group CG4 may output fourth digital signals DOUT4. Each of the digital signals DOUT1 to DOUT4 may include a reset sampling value and a signal sampling value.

The high-speed scanner 121 may include first to fourth sub scanners SS1 to SS4. Each of the first to fourth sub scanners SS1 to SS4 may receive the clock signal CLK, the read trigger signal RTRIG, and a corresponding one of cluster enable signals CEN1 to CEN4. The cluster enable signals CEN1 to CEN4 may be signals for selecting a cluster, which will perform the digital signal output operation, from among the plurality of clusters.

For example, the first sub scanner SS1 may receive the first cluster enable signal CEN1 and may provide first scanner output signals SO1 to the pixel array 110. The second sub scanner SS2 may receive the second cluster enable signal CEN2 and may provide second scanner output signals SO2 to the pixel array 110. The third sub scanner SS3 may receive the third cluster enable signal CEN3 and may provide third scanner output signals SO3 to the pixel array 110. The fourth sub scanner SS4 may receive the fourth cluster enable signal CEN4 and may provide fourth scanner output signals SO4 to the pixel array 110.

The first scanner output signals SO1 may be output to a fifth part CL11, CL21, CL31, and CL41 of the plurality of clusters. The second scanner output signals SO2 may be output to a sixth part CL12, CL22, CL32, and CL42 of the plurality of clusters. The third scanner output signals SO3 may be output to a seventh part CL13, CL23, CL33, and CL43 of the plurality of clusters. The fourth scanner output signals SO4 may be output to an eighth part CL14, CL24, CL34, and CL44 of the plurality of clusters.

When the first cluster enable signal CEN1 is at a high level, the first sub scanner SS1 may output the first scanner output signals SO1 including the reset enable signals R_EN and the signal enable signals S_EN in response to the clock signal CLK and the read trigger signal RTRIG. The pixel array 110 may output reset sampling values and signal sampling values stored in the fifth part CL11, CL21, CL31, and CL41 of the plurality of clusters through digital signals DOUT1 to DOUT4 in response to the first scanner output signals 501. The remaining cluster enable signals CEN2 to CEN4 are similar to the first cluster enable signal CEN1, and thus, additional description will be omitted to avoid redundancy.

The plurality of clusters CL11 to CL44 may receive the corresponding scanner output signals SO1 to SO4 from the high-speed scanner 121. The plurality of clusters CL11 to CL44 may output the reset sampling values "R" and the signal sampling values "S" sequentially or randomly based on the scanner output signals SO1 to SO4.

Referring to FIG. 5B, a cluster may include a plurality of banks B1 to B4. A configuration of the cluster CL illustrated in FIG. 5B is an example, and the present disclosure is not limited thereto. For example, in the cluster CL, the number of banks, the number of memory cells included in a bank, the number of digital pixels corresponding to one bank, the number of word lines, and the number of bit lines may be variously changed or modified.

Each of the plurality of banks B1 to B4 may include a plurality of memory cells. That is, in each of the plurality of banks B1 to B4, memory cells MC of the memory circuit MCT of a plurality of digital pixels DP may be implemented in the form of an array. For example, each of the plurality of banks B1 to B4 may include the memory cells MC arranged in first to fourth rows and first and second columns. The first bank B1 may include a plurality of memory cells MC11 to MC42, the second bank B2 may include a plurality of memory cells MC51 to MC82, the third bank B3 may include a plurality of memory cells MC91 to MCc2, and the fourth bank B4 may include a plurality of memory cells MCd1 to MCg2.

It is assumed that each of the plurality of banks B1 to B4 corresponds to two digital pixels DP. For example, a first part MC11, MC12, MC21, and MC22 of the memory cells MC11 to MC42 included in the first bank B1 may correspond to the first digital pixel DP1, and a second part MC31, MC32, MC41, and MC42 of the memory cells MC11 to MC42 included in the first bank B1 may correspond to the second digital pixel DP2. That is, the first bank B1 may store the reset sampling values "R" and the signal sampling values "S" of the first and second digital pixels DP1 and DP2. The remaining banks B2 to B4 are similar to the first bank B1, and thus, additional description will be omitted to avoid redundancy.

The memory cells MC11 to MCg2 included in the cluster CL may be connected with word lines WL1 to WL16 and bit lines BL1 and BL2. As described above, the memory cells MC11 to MCg2 may be configured to store corresponding digital signals DOUT (e.g., the reset sampling values "R" or the signal sampling values "S").

The cluster CL may receive the reset enable signals R_EN1 to R_EN8 and the signal enable signals S_EN1 to S_EN8 through the word lines WL1 to WL16 from the high-speed scanner 121. The cluster CL may output the reset sampling value "R" and the signal sampling value "S" stored therein through the bit lines BL1 and BL2 as a plurality of digital bit signals DB1 and DB2. That is, each of the digital signals DOUT1 to DOUT4 of FIG. 5A may include a plurality of digital bit signals DB1 and DB2.

In an embodiment, the first bank B1 may receive the enable signals R_EN1, S_EN1, R_EN2, and S_EN2, the second bank B2 may receive the enable signals R_EN3, S_EN3, R_EN4, and S_EN4, the third bank B3 may receive the enable signals R_EN5, S_EN5, R_EN6, and S_EN6, and the fourth bank B4 may receive the enable signals R_EN7, S_EN7, R_EN8, and S_EN8.

The memory cells MC11 and MC12 placed at the first row may receive the first reset enable signal R_EN1 through the first word line WL1. In response to the first reset enable signal R_EN1 (or when the first reset enable signal R_EN1 is at the high level), the reset sampling value "R" stored in the memory cells MC11 and MC12 placed at the first row may be output through the bit lines BL1 and BL2 as the digital bit signals DB1 and DB2. The memory cells MC21 and MC22 placed at the second row may receive the first signal enable signal S_EN1 through the second word line WL2. In response to the first signal enable signal S_EN1 (or when the first signal enable signal S_EN1 is at the high level), the signal sampling value "S" stored in the memory cells MC21 and MC22 placed at the second row may be output through the bit lines BL1 and BL2 as the digital bit signals DB1 and DB2.

The memory cells MC31 and MC32 placed at the third row may receive the second reset enable signal R_EN2 through the third word line WL3. In response to the second reset enable signal R_EN2 (or when the second reset enable signal R_EN2 is at the high level), the reset sampling value "R" stored in the memory cells MC31 and MC32 placed at the third row may be output through the bit lines BL1 and BL2 as the digital bit signals DB1 and DB2. The memory cells MC41 and MC42 placed at the fourth row may receive the second signal enable signal S_EN2 through the fourth word line WL4. In response to the second signal enable signal S_EN2 (or when the second signal enable signal S_EN2 is at the high level), the signal sampling value "S" stored in the memory cells M421 and MC42 placed at the fourth row may be output through the bit lines BL1 and BL2 as the digital bit signals DB1 and DB2. Memory cells included in the remaining banks B2 to B4 are similar to those included in the first bank B1, and thus, additional description will be omitted to avoid redundancy.

Figure 6:
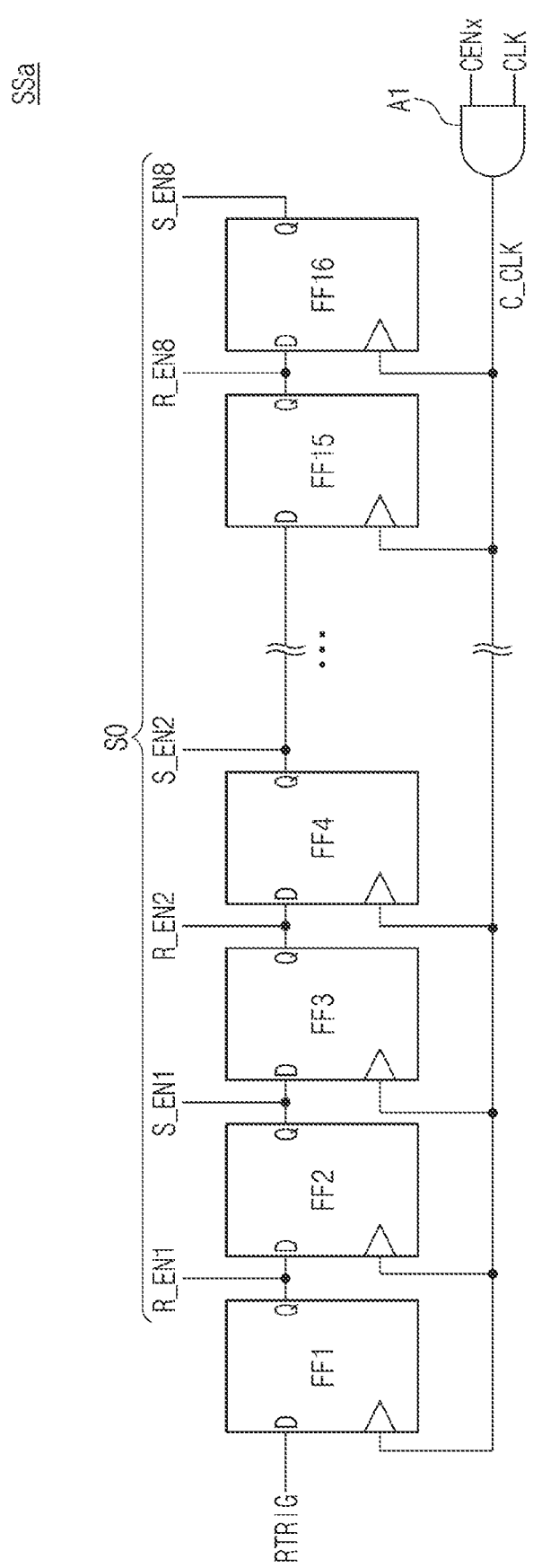
FIG. 6 is a block diagram illustrating a sub scanner of FIG. 5A.

FIG. 6 is a block diagram illustrating a sub scanner of FIG. 5A. Referring to FIGS. 5A and 6, a sub scanner SSa may receive the read trigger signal RTRIG, a cluster enable signal CENx, and the clock signal CLK from the sensor controller 131. The sub scanner SSa may provide scanner output signals SO to the pixel array 110. That is, the sub scanner SSa may output the first to eighth reset enable signals R_EN1 to R_EN8 and the first to eighth signal enable signals S_EN1 to S_EN8. The sub scanner SSa may include first to sixteenth flip-flops FF1 to FF16, and a first AND gate A1. However, the present disclosure is not limited thereto. For example, the number of flip-flops included in the sub scanner SSa may increase or decrease depending on a way to implement.

The first AND gate A1 may receive the clock signal CLK and the cluster enable signal CENx. The first AND gate A1 may perform a logical operation on the clock signal CLK and the cluster enable signal CENx. The first AND gate A1 may output a result of performing the logical operation on the clock signal CLK and the cluster enable signal CENx as a cluster clock signal C_CLK.

Each of the first to sixteenth flip-flops FF1 to FF16 may include a clock input terminal, an input terminal "D", and an output terminal "Q". Each of the first to sixteenth flip-flops FF1 to FF16 may receive the cluster clock signal C_CLK through the clock input terminal, may receive an input signal through the input terminal "D", and may output an output signal through the output terminal "Q".

Odd-numbered flip-flops FF1, FF3, FF5, FF7, FF9, FF11, FF13, and FF15 of the first to sixteenth flip-flops FF1 to FF16 may output the first to eighth reset enable signals R_EN1 to R_EN8, respectively. Even-numbered flip-flops FF2, FF4, FF6, FF8, FF10, FF12, FF14, and FF16 of the first to sixteenth flip-flops FF1 to FF16 may output the first to eighth signal enable signals S_EN1 to S_EN8, respectively.

The first to sixteenth flip-flops FF1 to FF16 may operate in response to the cluster clock signal C_CLK. Each of the first to sixteenth flip-flops FF1 to FF16 may output a logical level (e.g., the high level or the low level) of the input signal through the output terminal "Q" as the output signal in response to a rising edge (e.g., a falling edge) of the cluster clock signal C_CLK.

The first to sixteenth flip-flops FF1 to FF16 may be connected in series. That is, the first to sixteenth flip-flops FF1 to FF16 may be connected in a chain structure. For example, the first reset enable signal R_EN1 output from the output terminal "Q" of the first flip-flop FF1 may be input to the input terminal "D" of the second flip-flop FF2 as an input signal. The first signal enable signal S_EN1 output from the output terminal "Q" of the second flip-flop FF2 may be input to the input terminal "D" of the third flip-flop FF3 as an input signal. The second reset enable signal R_EN2 output from the output terminal "Q" of the third flip-flop FF3 may be input to the input terminal "D" of the fourth flip-flop FF4 as an input signal. The second signal enable signal S_EN2 output from the output terminal "Q" of the fourth flip-flop FF4 may be input to the input terminal "D" of the fifth flip-flop FF5 as an input signal. The remaining flip-flops FF5 to FF16 may be connected to be similar to those described above, and thus, additional description will be omitted to avoid redundancy.

In an embodiment, to prevent a clock racing phenomenon, the sub scanner SSa may receive the clock signal CLK and the read trigger signal RTRIG in a direction that is opposite to a direction in which the read trigger signal RTRIG progresses. For example, the sub scanner SSa may receive the clock signal CLK progressing in a first direction and may receive the read trigger signal RTRIG progressing in a second direction facing away from the first direction.

Figure 7A:
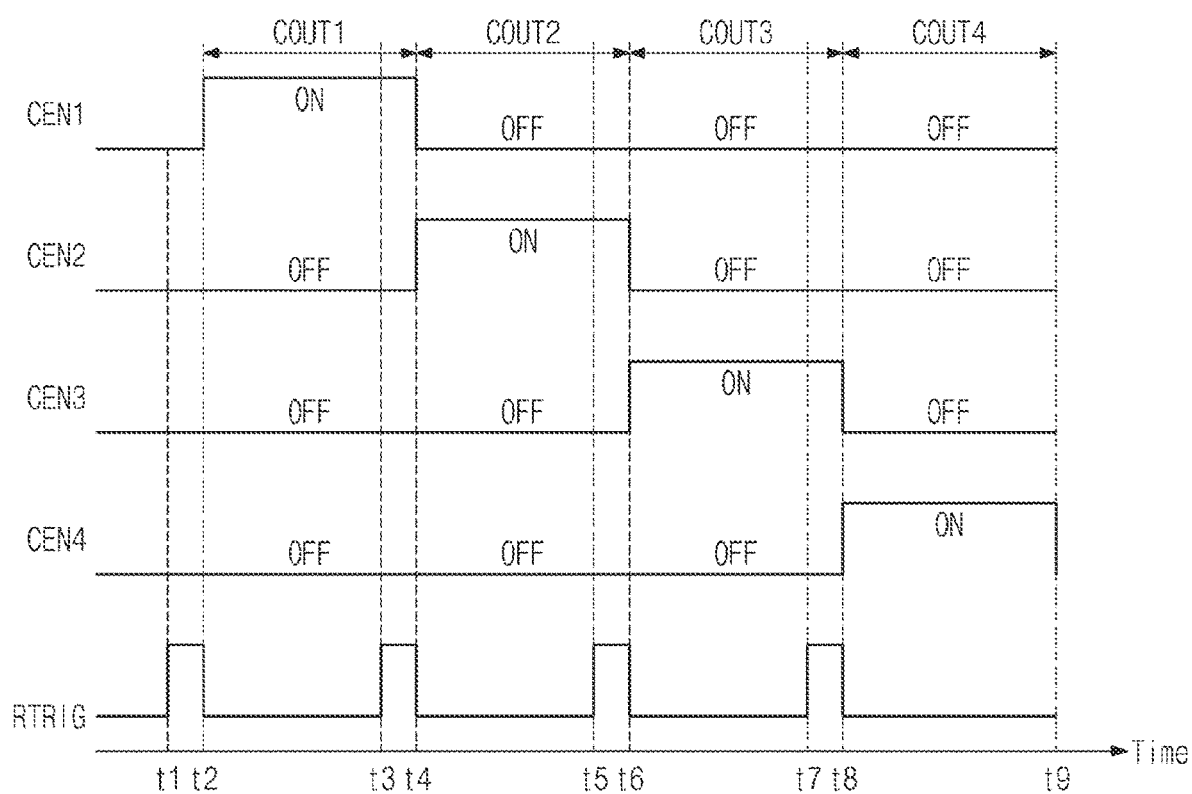
FIG. 7A is a timing diagram illustrating a plurality of cluster enable signals of FIG. 5A.
Figure 7B:
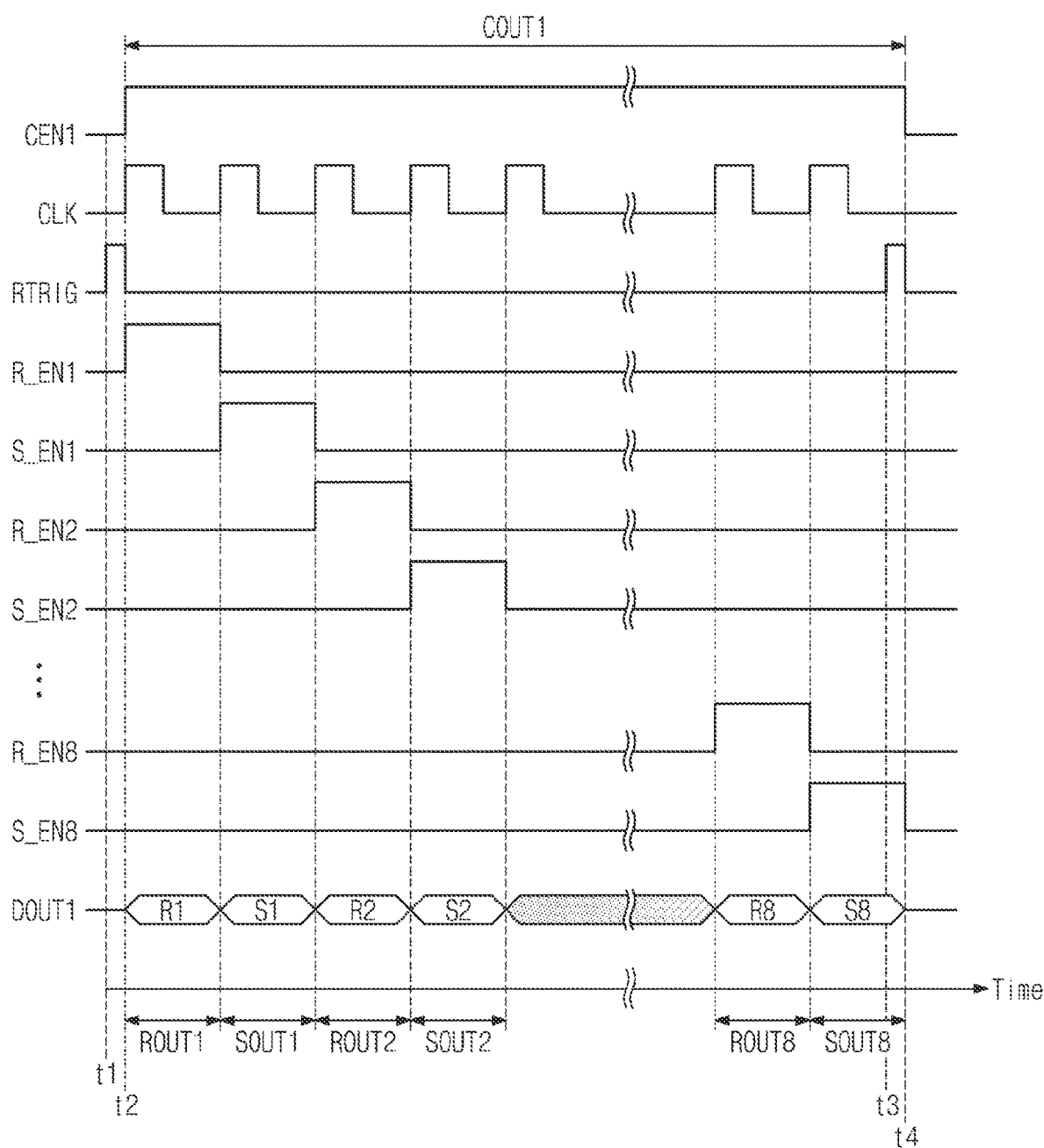
FIG. 7B is a timing diagram illustrating an operation of an image sensor device of FIG. 1.

FIG. 7A is a timing diagram illustrating a plurality of cluster enable signals of FIG. 5A. FIG. 7B is a timing diagram illustrating an operation of an image sensor device of FIG. 1.

Referring to FIGS. 5A and 7A, during a first cluster output period COUT1, the first cluster enable signal CEN1 may be at logical high, the second cluster enable signal CEN2 may be at logical low, the third cluster enable signal CEN3 may be at logical low, and the fourth cluster enable signal CEN4 may be at logical low. During a second cluster output period COUT2, the first cluster enable signal CEN1 may be at logical low, the second cluster enable signal CEN2 may be at logical high, the third cluster enable signal CEN3 may be at logical low, and the fourth cluster enable signal CEN4 may be at logical low.

During a third cluster output period COUT3, the first cluster enable signal CEN1 may be at logical low, the second cluster enable signal CEN2 may be at logical low, the third cluster enable signal CEN3 may be at logical high, and the fourth cluster enable signal CEN4 may be at logical low. During a fourth cluster output period COUT4, the first cluster enable signal CEN1 may be at logical low, the second cluster enable signal CEN2 may be at logical low, the third cluster enable signal CEN3 may be at logical low, and the fourth cluster enable signal CEN4 may be at logical high.

The read trigger signal RTRIG may be a signal for starting or initiating a digital signal (DOUT) output operation at the cluster CL. The read trigger signal RTRIG may be enabled as much as the number of clusters. For example, the read trigger signal RTRIG may transition from logical low to logical high at a first time t1, a third time t3, a fifth time t5, and a seventh time t7, and may transition from logical high to logical low at a second time t2, a fourth time t4, a sixth time t6, and an eighth time t8.

The read trigger signal RTRIG may be enabled before the cluster enable signals CEN1 to CEN4 are enabled. For example, the read trigger signal RTRIG may be enabled from the first time t1 to the second time t2, and then, the first cluster enable signal CEN1 may be enabled from the second time t2 to the fourth time t4. The read trigger signal RTRIG may be enabled from the third time t3 to the fourth time t4, and then, the second cluster enable signal CEN2 may be enabled from the fourth time t4 to the sixth time t6. The read trigger signal RTRIG may be enabled from the fifth time t5 to the sixth time t6, and then, the third cluster enable signal CEN3 may be enabled from the sixth time t6 to the eighth time t8. The read trigger signal RTRIG may be enabled from the seventh time t7 to the eighth time t8, and then, the fourth cluster enable signal CEN4 may be enabled from the eighth time t8 to a ninth time t9.

During the first cluster output period COUT1, because the first cluster enable signal CEN1 is at logical high, the first sub scanner SS1 may be enabled. That is, the plurality of flip-flops FF1 to FF16 of the first sub scanner SS1 may receive the cluster clock signal C_CLK toggling. As such, the first sub scanner SS1 may provide the first scanner output signals SO1 to the clusters CL11, CL21, CL31, and CL41 connected with the first sub scanner SS1. The clusters CL11, CL21, CL31, and CL41 connected with the first sub scanner SS1 may output the reset sampling values "R" and the signal sampling values "S" stored therein, in response to the first scanner output signals SO1.

During the second cluster output period COUT2, because the second cluster enable signal CEN2 is at logical high, the second sub scanner SS2 may be enabled, and the clusters CL12, CL22, CL32, and CL42 connected with the second sub scanner SS2 may output the reset sampling values "R" and the signal sampling values "S" stored therein, in response to the second scanner output signals SO2.

During the third cluster output period COUT3, because the third cluster enable signal CEN3 is at logical high, the third sub scanner SS3 may be enabled, and the clusters CL13, CL23, CL33, and CL43 connected with the third sub scanner SS3 may output the reset sampling values "R" and the signal sampling values "S" stored therein, in response to the third scanner output signals SO3.

During the fourth cluster output period COUT4, because the fourth cluster enable signal CEN4 is at logical high, the fourth sub scanner SS4 may be enabled, and the clusters CL14, CL24, CL34, and CL44 connected with the fourth sub scanner SS4 may output the reset sampling values "R" and the signal sampling values "S" stored therein, in response to the fourth scanner output signals SO4.

Referring to FIG. 7B, when the first cluster enable signal CEN1 is at logical high, the first sub scanner SS1 may be enabled, thus outputting the first scanner output signals SO1. During the first cluster output period COUT1, the first cluster enable signal CEN1 may be at logical high. That is, the first cluster enable signal CEN1 may transition from logical low to logical high at a second time t2 and may transition from logical high to logical low at a fourth time t4. During the first cluster output period COUT1, the first sub scanner SS1 may be enabled, thus outputting the first scanner output signals SO1. The clusters CL11, CL21, CL31, and CL41 connected with the first sub scanner SS1 may output the reset sampling values "R" and the signal sampling values "S" stored therein, in response to the first scanner output signals SO1.

The first reset enable signal R_EN1 may be enabled in a first reset output period ROUT1, the first signal enable signal S_EN1 may be enabled in a first signal output period SOUT1, the second reset enable signal R_EN2 may be enabled in a second reset output period ROUT2, and the second signal enable signal S_EN2 may be enabled in a second signal output period SOUT2. The remaining reset enable signals R_EN3 to R_EN8 and the remaining signal enable signals S_EN3 to S_EN8 are similar to those described above, and thus, additional description will be omitted to avoid redundancy.

In the first reset output period ROUT1, because only the first reset enable signal R_EN1 is at logical high (or is enabled) and the remaining signals R_EN2 to R_EN8 and S_EN1 to S_EN8 are at logical low (or are disabled), a reset sampling value R1 stored in the memory cells MC11 and MC12 connected with the first word line WL1 may be output through the bit lines BL1 and BL2 as the digital bit signals DB1 and DB2 or the digital signals DOUT1.

In the first signal output period SOUT1, because only the first signal enable signal S_EN1 is at logical high (or is enabled) and the remaining signals R_EN1 to R_EN8 and S_EN2 to S_EN8 are at logical low (or are disabled), a signal sampling value S1 stored in the memory cells MC21 and MC22 connected with the second word line WL2 may be output through the bit lines BL1 and BL2 as the digital bit signals DB1 and DB2 or the digital signals DOUT1. The remaining signals R_EN2 to R_EN8 and S_EN2 to S_EN8 are similar to those described above, and thus, additional description will be omitted to avoid redundancy.

As described above, the sub scanner SSa may output the reset enable signals R_EN1 to R_EN8 and the signal enable signals S_EN1 to S_EN8 such that rows are sequentially selected. As such, the image sensor device 100 may output reset sampling values and signal sampling values stored in memory cells to the digital signal processing unit 132 at high speed.

Figure 8A:
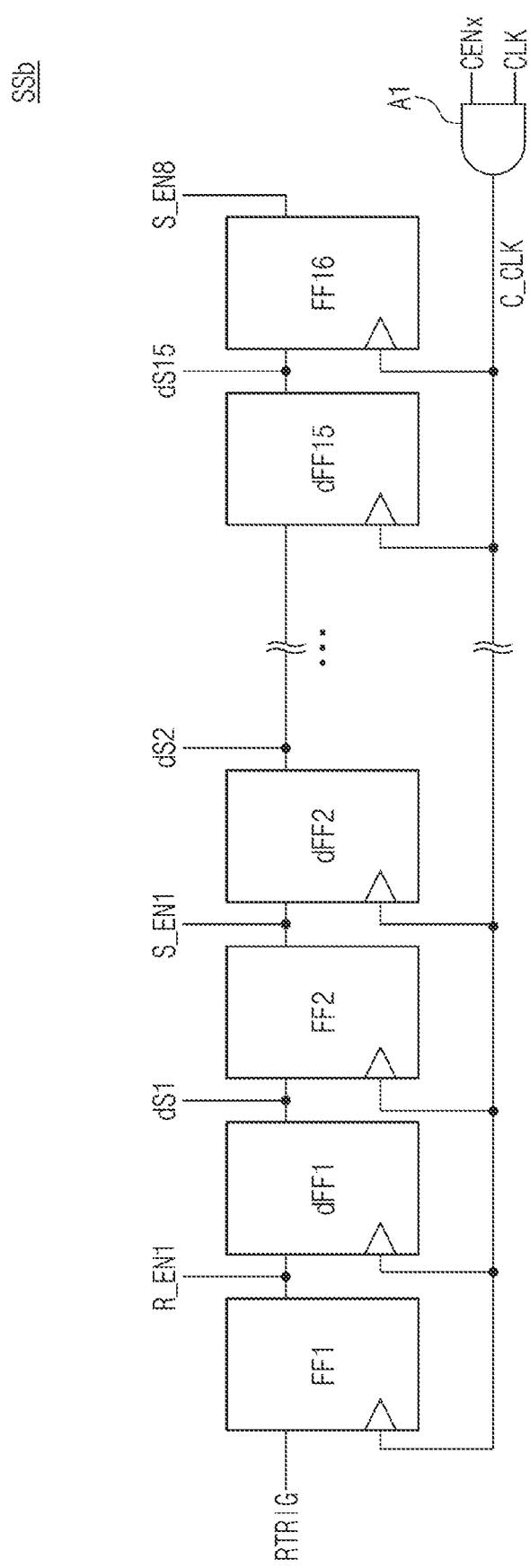
FIG. 8A is a block diagram illustrating a sub scanner of FIG. 5A.

FIG. 8A is a block diagram illustrating a sub scanner of FIG. 5A. Referring to FIGS. 5A and 8A, a sub scanner SSb may generate the reset enable signals R_EN1 to R_EN8, the signal enable signals S_EN1 to S_EN8, and a plurality of dummy signals dS1 to dS15 for the purpose of outputting the reset sampling values "R" and the signal sampling values "S" stored in memory cells at high speed. The sub scanner SSb may include the first to sixteenth flip-flops FF1 to FF16, first to fifteenth dummy flip-flops dFF1 to dFF15, and the first AND gate A1. However, the present disclosure is not limited thereto. For example, in the sub scanner SSb, the number of flip-flops and the number of dummy flip-flops may increase or decrease depending on a way to implement.

The first AND gate A1 may receive the clock signal CLK and the cluster enable signal CENx. The first AND gate A1 may perform a logical operation on the clock signal CLK and the cluster enable signal CENx. The first AND gate A1 may output a result of performing the logical operation on the clock signal CLK and the cluster enable signal CENx as the cluster clock signal C_CLK.

Each of the first to sixteenth flip-flops FF1 to FF16 and the first to fifteenth dummy flip-flops dFF1 to dFF15 may include a clock input terminal, an input terminal "D", and an output terminal "Q". Each of the first to sixteenth flip-flops FF1 to FF16 and the first to fifteenth dummy flip-flops dFF1 to dFF15 may receive the cluster clock signal C_CLK through the clock input terminal, may receive an input signal through the input terminal "D", and may output an output signal through the output terminal "Q".

Odd-numbered flip-flops FF1, FF3, FF5, FF7, FF9, FF11, FF13, and FF15 of the first to sixteenth flip-flops FF1 to FF16 may output the first to eighth reset enable signals R_EN1 to R_EN8, respectively. Even-numbered flip-flops FF2, FF4, FF6, FF8, FF10, FF12, FF14, and FF16 of the first to sixteenth flip-flops FF1 to FF16 may output the first to eighth signal enable signals S_EN1 to S_EN8, respectively.

The first to fifteenth dummy flip-flops dFF1 to dFF15 may output the first to fifth dummy signals dS1 to dS15, respectively.

Each of the first to sixteenth flip-flops FF1 to FF16 and the first to fifteenth dummy flip-flops dFF1 to dFF15 may operate in response to the cluster clock signal C_CLK. Each of first to sixteenth flip-flops FF1 to FF16 and the first to fifteenth dummy flip-flops dFF1 to dFF15 may output a logical level (e.g., the high level or the low level) of the input signal through the output terminal "Q" as the output signal in response to a rising edge (e.g., a falling edge) of the cluster clock signal C_CLK.

The first to sixteenth flip-flops FF1 to FF16 and the first to fifteenth dummy flip-flops dFF1 to dFF15 may be connected in series, with the first to fifteenth dummy flip-flops dFF1 to dFF15 interposed between the first to sixteenth flip-flops FF1 to FF16. That is, the first to sixteenth flip-flops FF1 to FF16 and the first to fifteenth dummy flip-flops dFF1 to dFF15 may be connected in a chain structure. For example, the first reset enable signal R_EN1 output from the output terminal "Q" of the first flip-flop FF1 may be input to the input terminal "D" of the first dummy flip-flop dFF1 as an input signal. The first dummy signal dS1 output from the output terminal "Q" of the first dummy flip-flop dFF1 may be input to the input terminal "D" of the second flip-flop FF2 as an input signal. The first signal enable signal S_EN1 output from the output terminal "Q" of the second flip-flop FF2 may be input to the input terminal "D" of the second dummy flip-flop dFF2 as an input signal. The second dummy signal dS2 output from the output terminal "Q" of the second dummy flip-flop dFF2 may be input to the input terminal "D" of the third flip-flop FF3 as an input signal.

The second reset enable signal R_EN2 output from the output terminal "Q" of the third flip-flop FF3 may be input to the input terminal "D" of the third dummy flip-flop dFF3 as an input signal. The third dummy signal dS3 output from the output terminal "Q" of the third dummy flip-flop dFF3 may be input to the input terminal "D" of the fourth flip-flop FF4 as an input signal. The second signal enable signal S_EN2 output from the output terminal "Q" of the fourth flip-flop FF4 may be input to the input terminal "D" of the fourth dummy flip-flop dFF4 as an input signal. The fourth dummy signal dS4 output from the output terminal "Q" of the fourth dummy flip-flop dFF4 may be input to the input terminal "D" of the fifth flip-flop FF5 as an input signal. The remaining flip-flops FF5 to FF16 and the remaining dummy flip-flops dFF5 to dFF15 may be connected to be similar to those described above, and thus, additional description will be omitted to avoid redundancy.

Figure 8B:
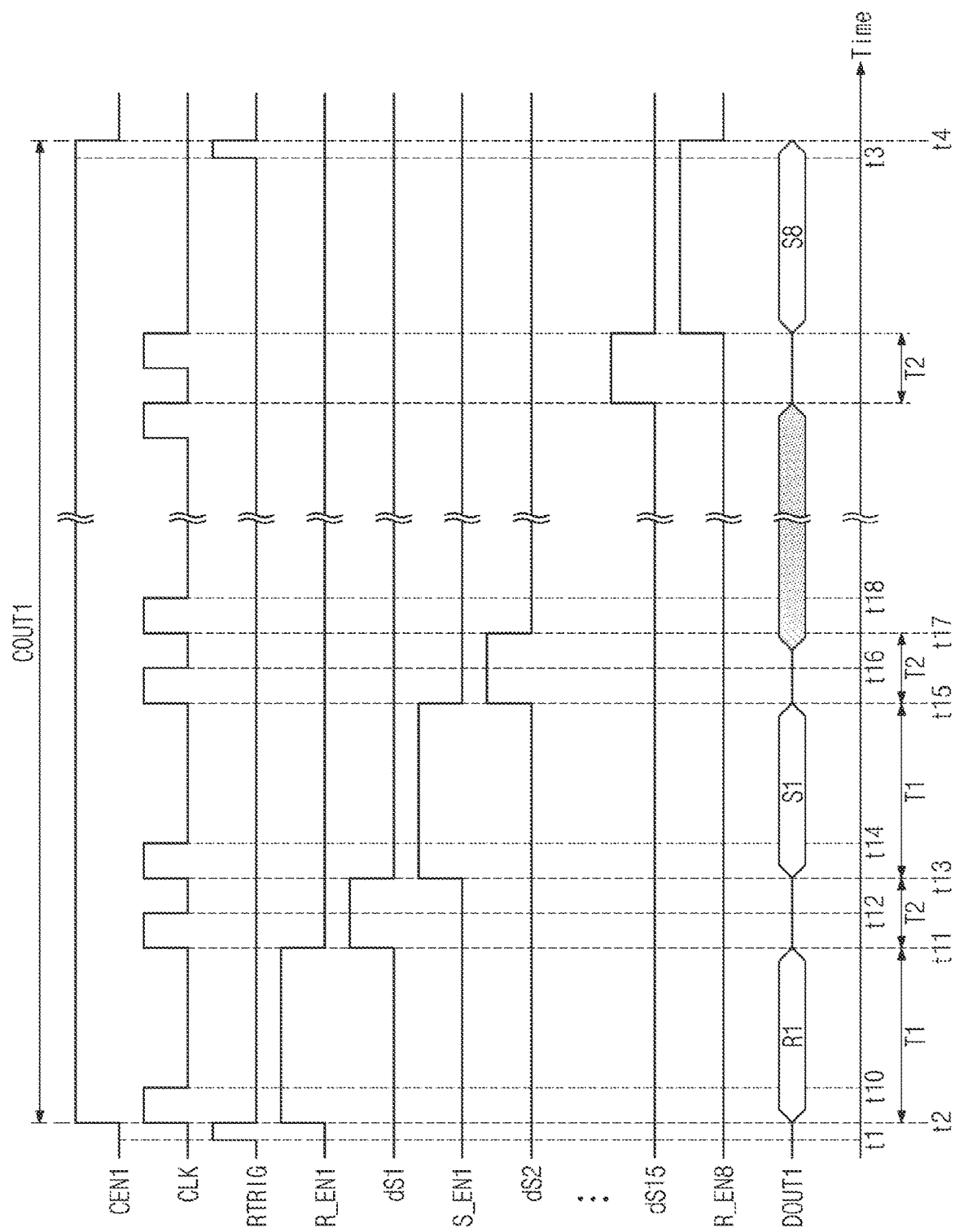
FIG. 8B is a timing diagram illustrating an operation of an image sensor device of FIG. 1.

FIG. 8B is a timing diagram illustrating an operation of an image sensor device of FIG. 1. Referring to FIGS. 8A and 8B, logical high periods of the reset enable signals R_EN1 to R_EN8 and logical high periods of the signal enable signals S_EN1 to S_EN8 may be prevented from overlapping each other by adjusting a timing of a rising edge (or a falling edge) of the clock signal CLK. That is, by using the plurality of dummy flip-flops dFF1 to dFF15, the sub scanner SSb may widen a difference between the logical high period of each of the reset enable signals R_EN1 to R_EN8 and the logical high period of each of the signal enable signals S_EN1 to S_EN8.

During a first cluster output period COUT1, the first cluster enable signal CEN1 may be at logical high. That is, the first cluster enable signal CEN1 may transition from logical low to logical high at a second time t2 and may transition from logical high to logical low at a fourth time t4.

The sub scanner SSb may receive the clock signal CLK different from a general clock signal. In the embodiment of FIG. 7B, the sub scanner SSa may receive a general clock signal CLK in which an interval between rising edges (or falling edges) of the clock signal CLK is uniform. On the other hand, in the embodiment of FIG. 8B, the sub scanner SSb may receive a processed clock signal CLK in which an interval of rising edges (or falling edges) of the clock signal CLK is changed.

That is, the clock signal CLK may transition from logical low to logical high at the second time t2 and may transition from logical high to logical low at a tenth time t10. The clock signal CLK may transition from logical low to logical high after a first time interval T1 passes from the second time t2, that is, at an eleventh time t11 and may transition from logical high to logical low at a twelfth time t12. The clock signal CLK may transition from logical low to logical high after a second time interval T2 shorter than the first time interval T1 passes from the eleventh time t11, that is, at a thirteenth time t13 and may transition from logical high to logical low at a fourteenth time t14. The clock signal CLK may transition from logical low to logical high after the first time interval T1 passes from the thirteenth time t13, that is, at a fifteenth time t15 and may transition from logical high to logical low at a sixteenth time t16. The clock signal CLK may transition from logical low to logical high after the second time interval T2 passes from the fifteenth time t15, that is, at a seventeenth time t17 and may transition from logical high to logical low at an eighteenth time t18. A waveform of the clock signal CLK from the eighteenth time t18 to the fourth time t4 is similar to that described above, and thus, additional description will be omitted to avoid redundancy. The first time interval T1 may be "N" times the second time interval T2 (N being a natural number more than 1).

As illustrated in FIG. 8B, time intervals between rising edges (or falling edges) of the clock signal CLK may be variable, not uniform. That is, a time interval between rising edges (or falling edges) of the clock signal CLK may repeat the first time interval T1 and the second time interval T2. In detail, a rising edge of the clock signal CLK may be generated at the second time t2, a rising edge of the clock signal CLK may be generated after the first time interval T1 passes from the second time t2, that is, at the eleventh time t11, a rising edge of the clock signal CLK may be generated after the second time interval T2 passes from the eleventh time t11, that is, at the thirteenth time t13, a rising edge of the clock signal CLK may be generated after the first time interval T1 passes from the thirteenth time t13, that is, at the fifteenth time t15, and a rising edge of the clock signal CLK may be generated after the second time interval T2 passes from the fifteenth time t15, that is, at the seventeenth time t17.

As illustrated in FIG. 8B, the first reset enable signal R_EN1 may transition from logical low to logical high at the second time t2 and may transition from logical high to logical low at the eleventh time t11. The first dummy signal dS1 may transition from logical low to logical high at the eleventh time t11 and may transition from logical high to logical low at the thirteenth time t13. The first signal enable signal S_EN1 may transition from logical low to logical high at the thirteenth time t13 and may transition from logical high to logical low at the fifteenth time t15. The second dummy signal dS2 may transition from logical low to logical high at the fifteenth time t15 and may transition from logical high to logical low at the seventeenth time t17. The remaining reset enable signals R_EN2 to R_EN8, the remaining signal enable signals S_EN2 to S_EN8, and the remaining dummy signals dS3 to dS15 are similar to those described above, and thus, additional description will be omitted to avoid redundancy.

By changing an interval between rising edges (or falling edges) of the clock signal CLK, an interval between logical high periods of a reset enable signal and a signal enable signal adjacent to each other may increase as much as the second time interval T2. That is, the first reset enable signal R_EN1 may transition from logical high to logical low at the eleventh time t11, and the first signal enable signal S_EN1 may transition from logical low to logical high after the second time interval T2 passes from the eleventh time t11, that is, at the thirteenth time t13. As such, logical high periods of a reset enable signal and a signal enable signal adjacent to each other may be prevented from overlapping each other.

Figure 9A:
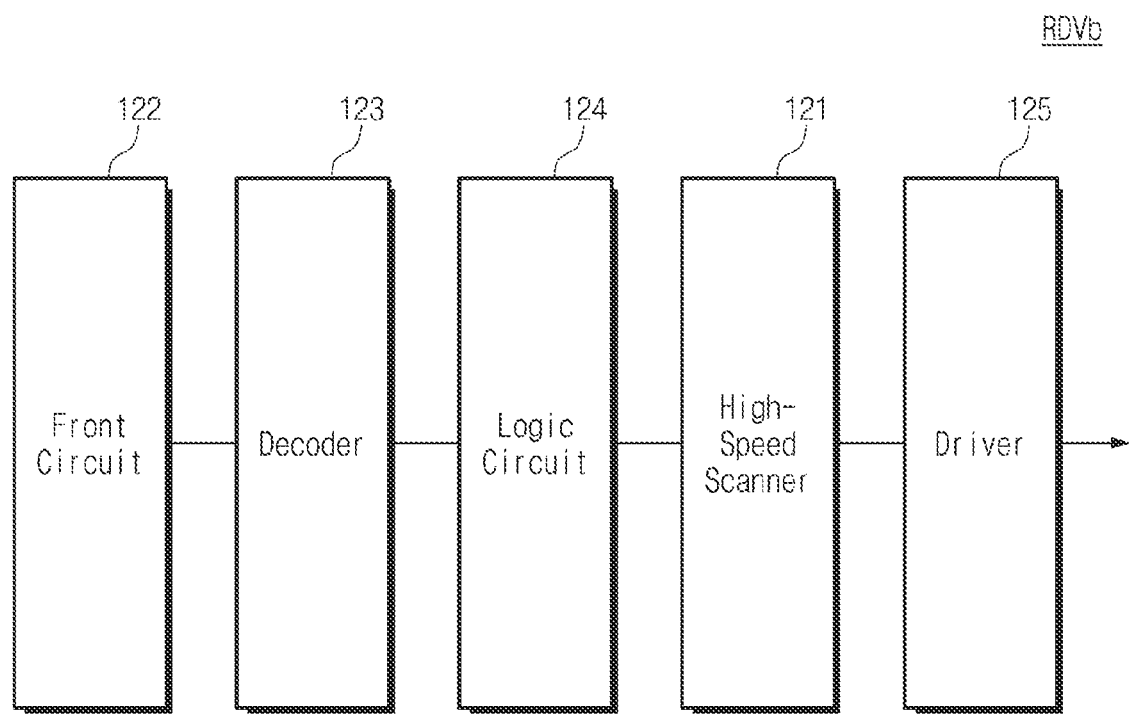
FIGS. 9A and 9B are block diagrams illustrating a row driver of FIG. 2A.
Figure 9B:
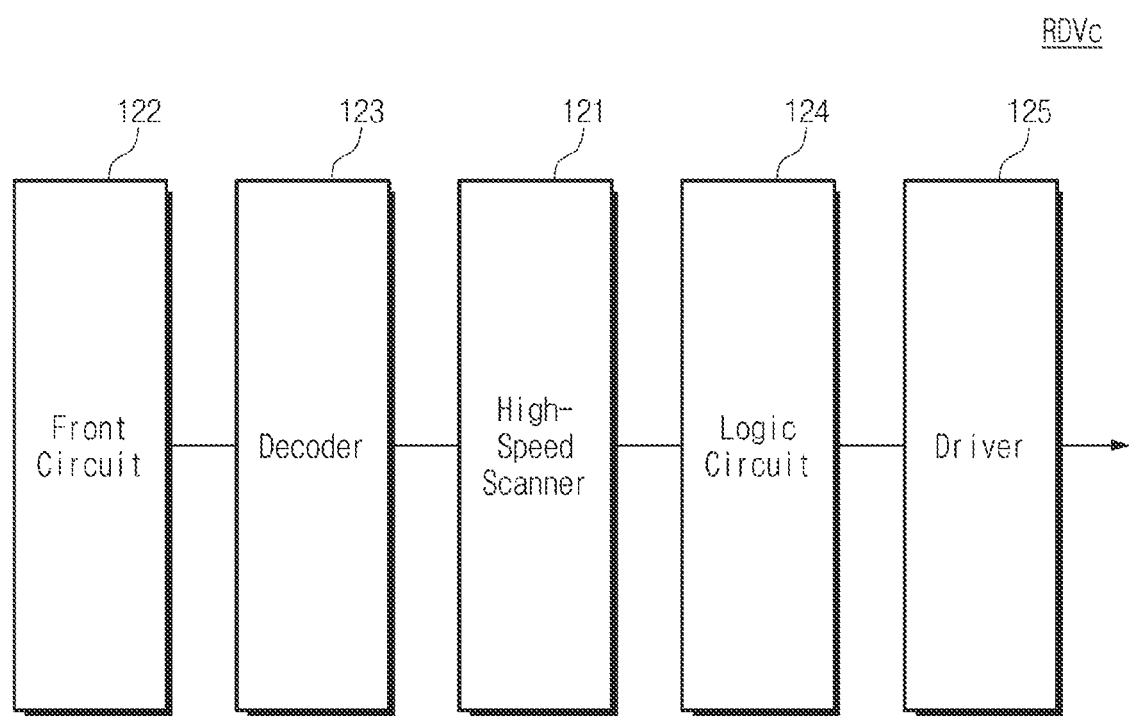

FIGS. 9A and 9B are block diagrams illustrating a row driver of FIG. 2A. Referring to FIGS. 2A and 9A, a row driver RDVb may include the high-speed scanner 121, the front circuit 122, the decoder 123, the logic circuit 124, and the driver 125. For convenience of description, additional description associated with the components described above will be omitted to avoid redundancy.

In the embodiment of FIG. 9A, the high-speed scanner 121 may be connected between the logic circuit 124 and the driver 125. That is, the high-speed scanner 121 may provide the plurality of scanner output signals SO1 to SO4 to the driver 125. The driver 125 may convert a voltage level of the plurality of scanner output signals SO1 to SO4 so as to be provided to the pixel array 110.

Referring to FIG. 9B, a row driver RDVc may include the high-speed scanner 121, the front circuit 122, the decoder 123, the logic circuit 124, and the driver 125. For convenience of description, additional description associated with the components described above will be omitted to avoid redundancy.

In the embodiment of FIG. 9B, the high-speed scanner 121 may be connected between the decoder 123 and the logic circuit 124. That is, the high-speed scanner 121 may provide the plurality of scanner output signals SO1 to SO4 to the logic circuit 124. The logic circuit 124 may output various control signals CTRL based on the plurality of scanner output signals SO1 to SO4.

Figure 10:
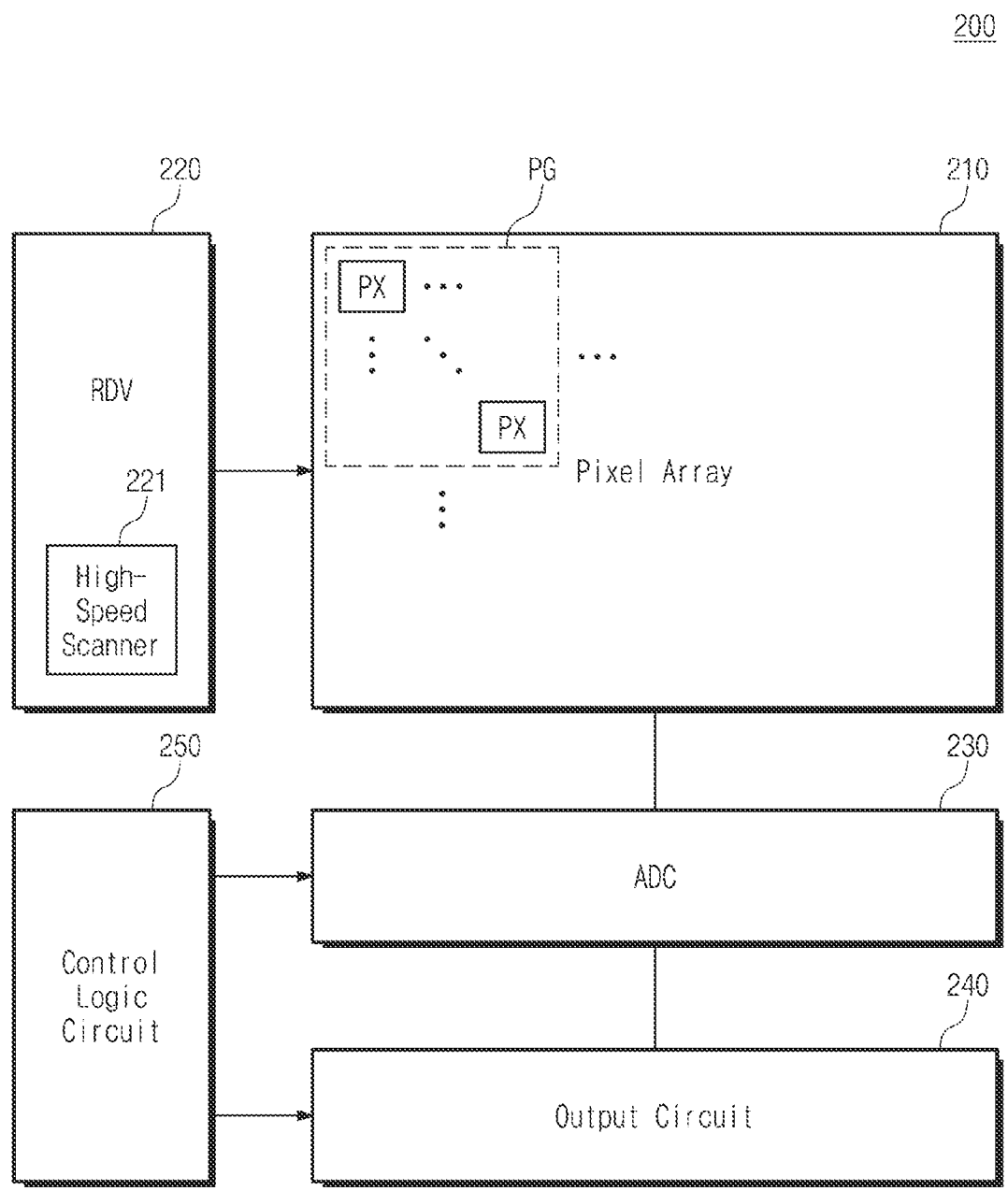
FIG. 10 is a block diagram illustrating an image sensor device according to an embodiment of the present disclosure.

FIG. 10 is a block diagram illustrating an image sensor device according to an embodiment of the present disclosure. Referring to FIG. 10, an image sensor device 200 may include a pixel array 210, a row driver 220 having a high-speed scanned 221, an analog-to-digital converter (ADC) 230, an output circuit 240, and a control logic circuit 250.

The pixel array 210 may include a plurality of pixels PX. Each of the plurality of pixels PX may be configured to output an analog signal based on a light incident from the outside, that is, an electrical signal proportional to a magnitude of the incident light. In an embodiment, the plurality of pixels PX may be combined with different color filters (e.g., R, G, and B color filters) for the purpose of receiving lights of different wavelengths.

The plurality of pixels PX of the pixel array 210 may be divided into a plurality of pixel groups PG. Each pixel group PG may include at least two or more pixels. Pixels constituting one pixel group PG may share one floating diffusion node (or a floating diffusion region). However, the present disclosure is not limited thereto. For example, pixels constituting one pixel group PG may share a plurality of floating diffusion nodes. In an embodiment, the pixel group PG may include 9 pixels PX arranged in 3 rows and 3 columns or may include 4 pixels PX arranged in 2 rows and 2 columns. However, the number of pixels constituting the pixel group PG is not limited thereto.

The pixel group PG may include pixels of the same type for the purpose of outputting information about the same color. For example, the pixel group PG may include a red (R) pixel to convert a light of a red spectrum into an electrical signal, a green (Gr/Gb) pixel to convert a light of a green spectrum into an electrical signal, or a blue (B) pixel to convert a light of a blue spectrum into an electrical signal. To this end, a plurality of color filters may be formed above the pixel group PG, and thus, a multi-color filter array (multi-CFA) may be implemented. The color filter array may be formed based on at least one of various patterns such as a Bayer pattern and a tetra pattern.

The row driver 220 may be configured to control the plurality of pixels PX included in the pixel array 210. For example, the row driver 220 may generate various control signals (e.g., a shutter signal, a transfer signal, a reset signal, and a select signal) for controlling the plurality of pixels PX. In an embodiment, the row driver 220 may control the plurality of pixels in units of a row, but the present disclosure is not limited thereto. For example, the row driver 220 may include the high-speed scanner 121 described with reference to FIGS. 1 to 9B. The high-speed scanner 121 may be configured to generate scanner output signals (or the reset enable signals and signal enable signals) for the purpose of sequentially or randomly selecting a plurality of rows at high speed.

In an embodiment, the image sensor device 200 may operate in a global shutter mode. All signals obtained through photoelectric conversion of all photo diodes PD corresponding to one frame may be simultaneously transferred to the floating diffusion node FD, and then, corresponding image signals may be sequentially output from a selected row. The high-speed scanner 121 according to an embodiment of the present disclosure may generate the reset enable signals R_EN and the signal enable signals S_EN and may output the reset sampling values "R" and the signal sampling values "S" at high speed.

The ADC 230 may convert an analog signal formed from each of the plurality of pixels PX into a digital signal and may output the converted digital signal as data. In an embodiment, the ADC 230 may generate the data based on correlated double sampling (CDS). Although not illustrated in drawings, the image sensor device 200 may further include a storage circuit or a memory configured to store the data output from the ADC 230 or a ramp signal generator configured to generate a ramp signal to be used for an operation of the ADC 230.

The output circuit 240 may send an image output from the ADC 230 to an external device (e.g., a display or a storage device). The control logic circuit 250 may be configured to control various components in the image sensor device 200 under control of an external control device (e.g., an image sensor controller or an application processor).

Figure 11:
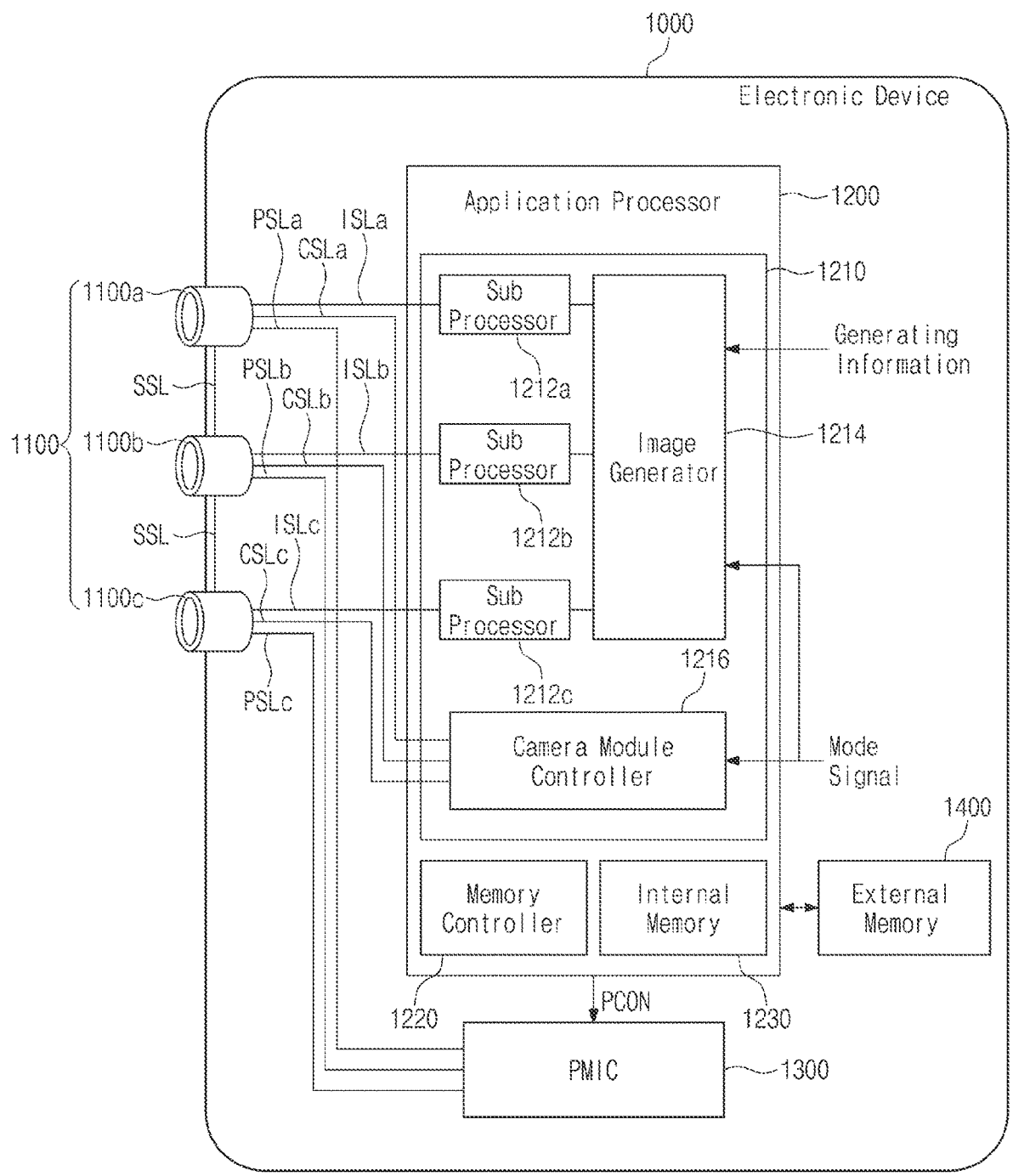
FIG. 11 is a block diagram illustrating a configuration of an electronic device including a multi-camera module according to an embodiment of the present disclosure.
Figure 12:
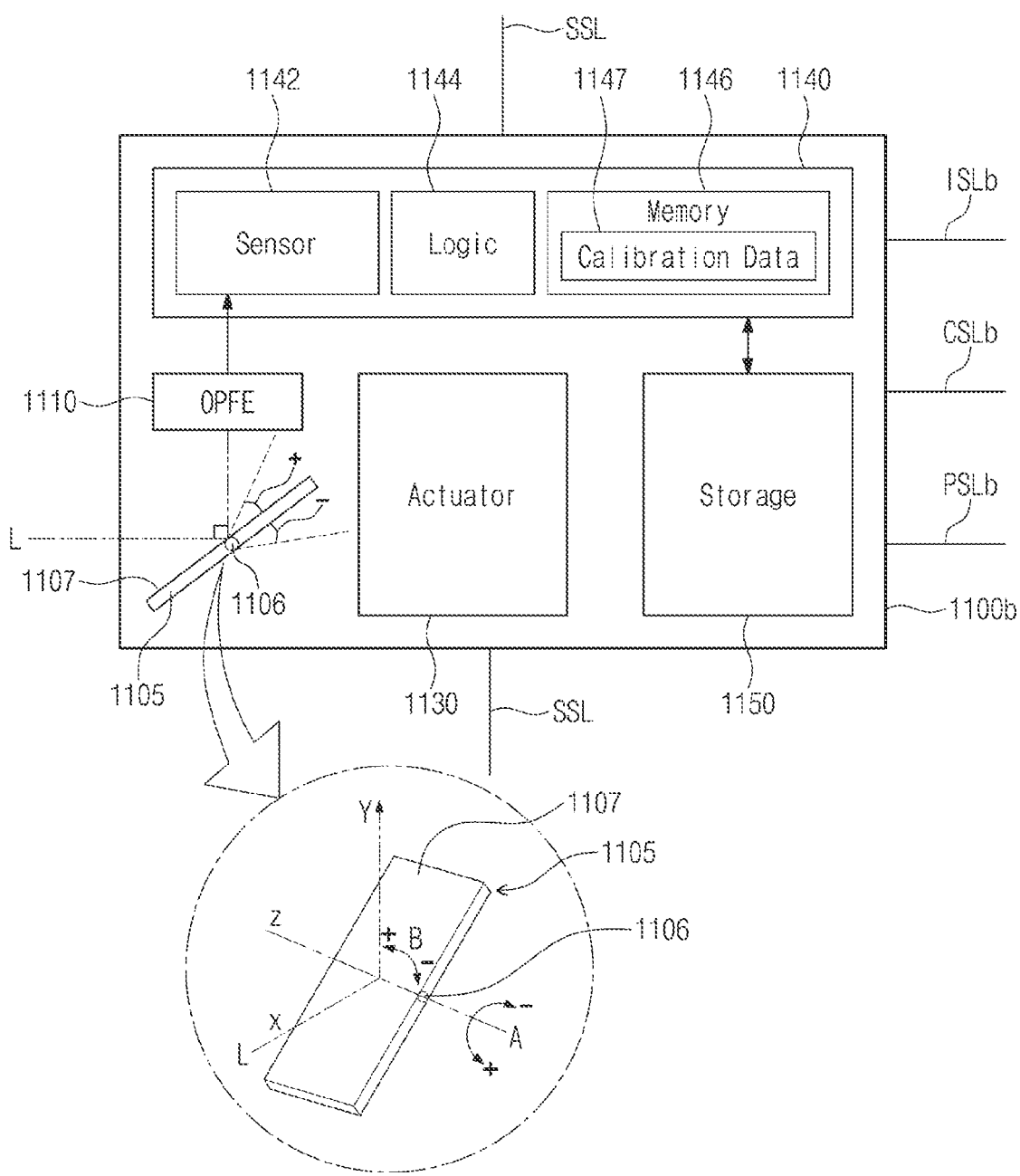
FIG. 12 illustrates a configuration of a camera module of FIG. 11.

FIG. 11 is a block diagram of an electronic device including a multi-camera module. FIG. 12 is a detailed block diagram of a camera module of FIG. 11. Referring to FIG. 11, an electronic device 1000 may include a camera module group 1100, an application processor 1200, a PMIC 1300, and an external memory 1400.

The camera module group 1100 may include a plurality of camera modules 1100a, 1100b, and 1100c. An embodiment in which three camera modules 1100a, 1100b, and 1100c are disposed is illustrated in FIG. 11, but embodiments are not limited thereto. In some embodiments, the camera module group 1100 may be modified to include only two camera modules. Also, in some embodiments, the camera module group 1100 may be modified to include "n" camera modules (n being a natural number of 4 or more).

Below, a detailed configuration of the camera module 1100b will be more fully described with reference to FIG. 12, but the following description may be equally applied to the remaining camera modules 1100a and 1100c.

Referring to FIG. 12, the camera module 1100b may include a prism 1105, an optical path folding element (OPFE) 1110, an actuator 1130, an image sensing device 1140, and a storage unit 1150.

The prism 1105 may include a reflecting plane 1107 of a light reflecting material and may change a path of light "L" incident from the outside.

In some embodiments, the prism 1105 may change a path of the light "L" incident in a first direction "X" to a second direction "Y" perpendicular to the first direction "X". Also, the prism 1105 may change the path of the light "L" incident in the first direction "X" to the second direction "Y" perpendicular to the first direction "X" by rotating the reflecting plane 1107 of the light reflecting material in direction "A" about a central axis 1106 or rotating the central axis 1106 in direction "B". In this case, the OPFE 1110 may move in a third direction "Z" perpendicular to the first direction "X" and the second direction "Y".

In some embodiments, as illustrated, a maximum rotation angle of the prism 1105 in direction "A" may be equal to or smaller than 15 degrees in a positive A direction and may be greater than 15 degrees in a negative A direction, but embodiments are not limited thereto.

In some embodiments, the prism 1105 may move within approximately 20 degrees in a positive or negative B direction, between 10 degrees and 20 degrees, or between 15 degrees and 20 degrees; here, the prism 1105 may move at the same angle in the positive or negative B direction or may move at a similar angle within approximately 1 degree.

In some embodiments, the prism 1105 may move the reflecting plane 1107 of the light reflecting material in the third direction (e.g., a Z direction) parallel to a direction in which the central axis 1106 extends.

The OPFE 1110 may include optical lenses composed of "m" groups (m being a natural number), for example. Here, "m" lenses may move in the second direction "Y" to change an optical zoom ratio of the camera module 1100b. For example, when a default optical zoom ratio of the camera module 1100b is "Z", the optical zoom ratio of the camera module 1100b may be changed to an optical zoom ratio of 3Z, 5Z, or 5Z or more by moving "m" optical lenses included in the OPFE 1110. The OPFE 1110 may further include an optical lens (e.g., an anamorphic lens) composed of "n" groups (n being a natural number) in front of the "m" lenses described above.

The actuator 1130 may move the OPFE 1110 or an optical lens (hereinafter referred to as an "optical lens") to a specific location. For example, the actuator 1130 may adjust a location of an optical lens such that an image sensor 1142 is placed at a focal length of the optical lens for accurate sensing.

The image sensing device 1140 may include the image sensor 1142, control logic 1144, and a memory 1146. The image sensor 1142 may sense an image of a sensing target by using the light "L" provided through an optical lens. In addition, the image sensor 1142 may include a high-speed scanner configured to generate reset enable signals and signal enable signals to select a row at high speed, which is described with reference to FIGS. 1 to 10. The image sensor 1142 may output reset sampling values and signal sampling values at high speed based on the reset enable signals and the signal enable signals.

The control logic 1144 may control overall operations of the camera module 1100b. For example, the control logic 1144 may control an operation of the camera module 1100b based on a control signal provided through a control signal line CSLb.

The memory 1146 may store information, which is necessary for an operation of the camera module 1100b, such as calibration data 1147. The calibration data 1147 may include information necessary for the camera module 1100b to generate image data by using the light "L" provided from the outside. The calibration data 1147 may include, for example, information about the degree of rotation described above, information about a focal length, information about an optical axis, etc. In the case where the camera module 1100b is implemented in the form of a multi-state camera in which a focal length varies depending on a location of an optical lens, the calibration data 1147 may include a focal length value for each location (or state) of the optical lens and information about auto focusing.

The storage unit 1150 may store image data sensed through the image sensor 1142. The storage unit 1150 may be disposed outside the image sensing device 1140 and may be implemented in a shape where the storage unit 1150 and a sensor chip constituting the image sensing device 1140 are stacked. In some embodiments, the storage unit 1150 may be implemented with an electrically erasable programmable read only memory (EEPROM), but embodiments are not limited thereto.

Referring to FIGS. 11 and 12 together, in some embodiments, each of the plurality of camera modules 1100a, 1100b, and 1100c may include the actuator 1130. As such, the same calibration data 1147 or different calibration data 1147 may be included in the plurality of camera modules 1100a, 1100b, and 1100c depending on operations of the actuators 1130 therein.

In some embodiments, one camera module (e.g., 1100b) among the plurality of camera modules 1100a, 1100b, and 1100c may be a folded lens shape of camera module in which the prism 1105 and the OPFE 1110 described above are included, and the remaining camera modules (e.g., 1100a and 1100c) may be a vertical shape of camera module in which the prism 1105 and the OPFE 1110 described above are not included; however, embodiments are not limited thereto.

In some embodiments, one camera module (e.g., 1100c) among the plurality of camera modules 1100a, 1100b, and 1100c may be, for example, a vertical shape of depth camera extracting depth information by using an infrared ray (IR). In this case, the application processor 1200 may merge image data provided from the depth camera and image data provided from any other camera module (e.g., 1100a or 1100b) and may generate a three-dimensional (3D) depth image.

In some embodiments, at least two camera modules (e.g., 1100a and 1100b) among the plurality of camera modules 1100a, 1100b, and 1100c may have different fields of view. In this case, the at least two camera modules (e.g., 1100a and 1100b) among the plurality of camera modules 1100a, 1100b, and 1100c may include different optical lenses, but are not limited thereto.

Also, in some embodiments, fields of view of the plurality of camera modules 1100a, 1100b, and 1100c may be different. In this case, the plurality of camera modules 1100a, 1100b, and 1100c may include different optical lenses, but are not limited thereto.

In some embodiments, the plurality of camera modules 1100a, 1100b, and 1100c may be disposed to be physically separated from each other. That is, the plurality of camera modules 1100a, 1100b, and 1100c may not use a sensing area of one image sensor 1142, but the plurality of camera modules 1100a, 1100b, and 1100c may include independent image sensors 1142 therein, respectively.

Returning to FIG. 11, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented with separate semiconductor chips.

The image processing device 1210 may include a plurality of sub image processors 1212a, 1212b, and 1212c, an image generator 1214, and a camera module controller 1216. The image processing device 1210 may include the plurality of sub image processors 1212a, 1212b, and 1212c, the number of which corresponds to the number of the plurality of camera modules 1100a, 1100b, and 1100c.

Image data respectively generated from the camera modules 1100a, 1100b, and 1100c may be respectively provided to the corresponding sub image processors 1212a, 1212b, and 1212c through separated image signal lines ISLa, ISLb, and ISLc. For example, the image data generated from the camera module 1100a may be provided to the sub image processor 1212a through the image signal line ISLa, the image data generated from the camera module 1100b may be provided to the sub image processor 1212b through the image signal line ISLb, and the image data generated from the camera module 1100c may be provided to the sub image processor 1212c through the image signal line ISLc. This image data transmission may be performed, for example, by using a camera serial interface (CSI) based on the MIPI (Mobile Industry Processor Interface), but embodiments are not limited thereto.

Meanwhile, in some embodiments, one sub image processor may be disposed to correspond to a plurality of camera modules. For example, the sub image processor 1212a and the sub image processor 1212c may be integrally implemented, not separated from each other as illustrated in FIG. 11; in this case, one of the pieces of image data respectively provided from the camera module 1100a and the camera module 1100c may be selected through a selection element (e.g., a multiplexer), and the selected image data may be provided to the integrated sub image processor.

The image data respectively provided to the sub image processors 1212a, 1212b, and 1212c may be provided to the image generator 1214. The image generator 1214 may generate an output image by using the image data respectively provided from the sub image processors 1212a, 1212b, and 1212c, depending on image generating information Generating Information or a mode signal.

In detail, the image generator 1214 may generate the output image by merging at least a portion of the image data respectively generated from the camera modules 1100a, 1100b, and 1100c having different fields of view, depending on the image generating information Generating Information or the mode signal. Also, the image generator 1214 may generate the output image by selecting one of the image data respectively generated from the camera modules 1100a,

1100b, and 1100c having different fields of view, depending on the image generating information Generating Information or the mode signal.

In some embodiments, the image generating information Generating Information may include a zoom signal or a zoom factor. Also, in some embodiments, the mode signal may be, for example, a signal based on a mode selected from a user.

In the case where the image generating information Generating Information is the zoom signal (or zoom factor) and the camera modules 1100a, 1100b, and 1100c have different visual fields (or fields of view), the image generator 1214 may perform different operations depending on a kind of the zoom signal. For example, in the case where the zoom signal is a first signal, the image generator 1214 may merge the image data output from the camera module 1100a and the image data output from the camera module 1100c and may generate the output image by using the merged image signal and the image data output from the camera module 1100b that is not used in the merging operation. In the case where the zoom signal is a second signal different from the first signal, without the image data merging operation, the image generator 1214 may select one of the image data respectively output from the camera modules 1100a, 1100b, and 1100c and may output the selected image data as the output image. However, embodiments are not limited thereto, and a way to process image data may be modified without limitation if necessary.

In some embodiments, the image generator 1214 may generate merged image data having an increased dynamic range by receiving a plurality of image data of different exposure times from at least one of the plurality of sub image processors 1212a, 1212b, and 1212c and performing high dynamic range (HDR) processing on the plurality of image data. Also, in some embodiments, the image generator 1214 may generate an image in which a color difference with a final image generated in the first mode is reduced, by performing a compensation operation on a second image.

The camera module controller 1216 may provide control signals to the camera modules 1100a, 1100b, and 1100c, respectively. The control signals generated from the camera module controller 1216 may be respectively provided to the corresponding camera modules 1100a, 1100b, and 1100c through control signal lines CSLa, CSLb, and CSLc separated from each other.

One of the plurality of camera modules 1100a, 1100b, and 1100c may be designated as a master camera (e.g., 1100b) depending on the image generating information Generating Information including a zoom signal or the mode signal, and the remaining camera modules (e.g., 1100a and 1100c) may be designated as a slave camera. The above designation information may be included in the control signals, and the control signals including the designation information may be respectively provided to the corresponding camera modules 1100a, 1100b, and 1100c through the control signal lines CSLa, CSLb, and CSLc separated from each other.

Camera modules operating as a master and a slave may be changed depending on the zoom factor or an operating mode signal. For example, in the case where the field of view of the camera module 1100a is wider than the field of view of the camera module 1100b and the zoom factor indicates a low zoom ratio, the camera module 1100b may operate as a master, and the camera module 1100a may operate as a slave. In contrast, in the case where the zoom factor indicates a high zoom ratio, the camera module 1100a may operate as a master, and the camera module 1100b may operate as a slave.

In some embodiments, the control signal provided from the camera module controller 1216 to each of the camera modules 1100a, 1100b, and 1100c may include a sync enable signal. For example, in the case where the camera module 1100b is used as a master camera and the camera modules 1100a and 1100c are used as a slave camera, the camera module controller 1216 may transmit the sync enable signal to the camera module 1100b. The camera module 1100b that is provided with sync enable signal may generate a sync signal based on the provided sync enable signal and may provide the generated sync signal to the camera modules 1100a and 1100c through a sync signal line SSL. The camera module 1100b and the camera modules 1100a and 1100c may be synchronized with the sync signal to transmit image data to the application processor 1200.

In some embodiments, the control signal provided from the camera module controller 1216 to each of the camera modules 1100a, 1100b, and 1100c may include mode information according to the mode signal. Based on the mode information, the plurality of camera modules 1100a, 1100b, and 1100c may operate in a first operating mode and a second operating mode with regard to a sensing speed.

In the first operating mode, the plurality of camera modules 1100a, 1100b, and 1100c may generate image signals at a first speed (e.g., may generate image signals of a first frame rate), may encode the image signals at a second speed (e.g., may encode the image signal of a second frame rate higher than the first frame rate), and transmit the encoded image signals to the application processor 1200. In this case, the second speed may be 30 times or less the first speed.

The application processor 1200 may store the received image signals, that is, the encoded image signals in the internal memory 1230 provided therein or the external memory 1400 placed outside the application processor 1200. Afterwards, the application processor 1200 may read and decode the encoded image signals from the internal memory 1230 or the external memory 1400 and may display image data generated based on the decoded image signals. For example, the corresponding one among sub image processors 1212a, 1212b, and 1212c of the image processing device 1210 may perform decoding and may also perform image processing on the decoded image signal.

In the second operating mode, the plurality of camera modules 1100a, 1100b, and 1100c may generate image signals at a third speed (e.g., may generate image signals of a third frame rate lower than the first frame rate) and transmit the image signals to the application processor 1200. The image signals provided to the application processor 1200 may be signals that are not encoded. The application processor 1200 may perform image processing on the received image signals or may store the image signals in the internal memory 1230 or the external memory 1400.

The PMIC 1300 may supply power, for example, power supply voltages to the plurality of camera modules 1100a, 1100b, and 1100c, respectively. For example, under control of the application processor 1200, the PMIC 1300 may supply a first power to the camera module 1100a through a power signal line PSLa, may supply a second power to the camera module 1100b through a power signal line PSLb, and may supply a third power to the camera module 1100c through a power signal line PSLc.

In response to a power control signal PCON from the application processor 1200, the PMIC 1300 may generate power corresponding to each of the plurality of camera modules 1100a, 1100b, and 1100c and may adjust a level of the power. The power control signal PCON may include a power adjustment signal for each operating mode of the plurality of camera modules 1100a, 1100b, and 1100c. For example, the operating mode may include a low-power mode. In this case, the power control signal PCON may include information about a camera module operating in the low-power mode and a set power level. Levels of the powers respectively provided to the plurality of camera modules 1100a, 1100b, and 1100c may be identical to each other or may be different from each other. Also, a level of a power may be dynamically changed.

According to embodiments of the present disclosure, an image sensor device may output a reset sampling value and a signal sampling value stored in a memory through a high-speed scanner at high speed. As such, an image sensor device with improved performance is provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An image sensor device comprising:
a pixel array including a plurality of digital pixels; and
a pixel driver including a high-speed scanner configured to generate reset enable signals and signal enable signals, and configured to control the plurality of digital pixels, wherein:
each of the plurality of digital pixels includes a photo detector, a comparator, and a memory circuit,
the pixel array outputs reset sampling values and signal sampling values stored in memory circuits at high speed based on the reset enable signals and the signal enable signals,
the high-speed scanner includes:
a first flip-flop configured to receive a clock signal and a read trigger signal and to output a first reset enable signal of the reset enable signals;
a first dummy flip-flop configured to receive the clock signal and the first reset enable signal and to output a first dummy signal; and
a second flip-flop configured to receive the clock signal and the first dummy signal and to output a first signal enable signal of the signal enable signals.

2. The image sensor device of claim 1, wherein:
the first flip-flop outputs a logical level of the read trigger signal as the first reset enable signal in response to the clock signal,
the first dummy flip-flop outputs a logical level of the first reset enable signal as the first dummy signal in response to the clock signal, and
the second flip-flop outputs a logical level of the first dummy signal as the first signal enable signal in response to the clock signal.

3. The image sensor device of claim 1, wherein:
the first reset enable signal is enabled at a first rising edge of the clock signal, the first dummy signal is enabled at a second rising edge of the clock signal, and the first signal enable signal is enabled at a third rising edge of the clock signal, and
a time interval between the first rising edge and the second rising edge is greater than a time interval between the second rising edge and the third rising edge.

4. The image sensor device of claim 1, wherein:
when the first reset enable signal is enabled, a reset sampling value stored in memory cells connected with the first reset enable signal is output, and
when the first signal enable signal is enabled, a signal sampling value stored in memory cells connected with the first signal enable signal is output.

5. The image sensor device of claim 1, wherein a time interval between rising edges of the clock signal is variable such that an enable period of the first reset enable signal and an enable period of the first signal enable signal do not overlap each other.

6. The image sensor device of claim 1, further comprising:
a sensor controller configured to provide the clock signal and the read trigger signal to the high-speed scanner and to control an operation of the image sensor device; and
a digital signal processing unit configured to perform a digital signal processing operation on a digital signal output from the plurality of digital pixels.

7. The image sensor device of claim 1, wherein the pixel driver includes:
a row driver configured to generate a photo detector control signal to be provided to the photo detector and a memory control signal to be provided to the memory circuit;
a ramp generator configured to generate a ramp signal to be provided to the comparator; and
a counter configured to generate a code to be provided to the memory circuit.

8. An image sensor device comprising:
a first flip-flop that outputs a first reset enable signal in response to a first transition of a clock signal and a first data signal;
a second flip-flop that outputs a first signal enable signal in response to a second transition of the clock signal and a second data signal derived from the first data signal; and
a pixel array comprising a pixel that outputs a reset sampling value in response to the pixel receiving the first reset enable signal and outputs a signal sampling value in response to the pixel receiving the first signal enable signal.

9. The image sensor device of claim 8, further comprising a third flip-flop disposed serially between the first flip-flop and the second flip-flop so as to output the second data signal in response to a third transition of the clock signal and the first reset enable signal.

10. The image sensor device of claim 9, wherein a first period between the first transition and the third transition of the clock signal is longer than a second period between the third transition and the second transition of the clock signal.

11. The image sensor device of claim 10, wherein the pixel array does not output either the reset sampling value or the signal sampling value during the second period.

* * * * *